United States Patent
Burgener et al.

(10) Patent No.: US 10,965,276 B2
(45) Date of Patent: *Mar. 30, 2021

(54) LOW NOISE CHARGE PUMP METHOD AND APPARATUS

(71) Applicant: pSemi Corporation, San Diego, CA (US)

(72) Inventors: Mark L. Burgener, San Diego, CA (US); Dylan J. Kelly, San Diego, CA (US); James S. Cable, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/793,969

(22) Filed: Feb. 18, 2020

(65) Prior Publication Data

US 2020/0259484 A1    Aug. 13, 2020

Related U.S. Application Data

(60) Continuation of application No. 16/169,831, filed on Oct. 24, 2018, now Pat. No. 10,608,617, which is a
(Continued)

(51) Int. Cl.
*H02M 3/07* (2006.01)
*H02M 3/18* (2006.01)
(Continued)

(52) U.S. Cl.
CPC .............. *H03K 3/013* (2013.01); *H02M 3/07* (2013.01); *H02M 3/073* (2013.01); *H03K 3/0315* (2013.01)

(58) Field of Classification Search
CPC ..... H03K 3/013; H03K 3/0315; H02M 3/073; H02M 3/07
See application file for complete search history.

(56) References Cited

U.S. PATENT DOCUMENTS

| 3,470,443 A | 9/1969 | Berry et al. |
| 3,646,361 A | 2/1972 | Pfiffner |
| (Continued) | | |

FOREIGN PATENT DOCUMENTS

| DE | 102005039138 A1 | 2/2007 |
| EP | 385641 | 9/1990 |
| (Continued) | | |

OTHER PUBLICATIONS

Wells, Kenneth B., Office Action received from the USPTO dated Feb. 13, 2013 for related U.S. Appl. No. 13/105,743, 55 pgs.
(Continued)

*Primary Examiner* — Kenneth B Wells
(74) *Attorney, Agent, or Firm* — Jaquez Land Greenhaus LLP; John Land, Esq.

(57) ABSTRACT

A charge pump method and apparatus is described having various aspects. Noise injection from a charge pump to other circuits may be reduced by limiting both positive and negative clock transition rates, as well as by limiting drive currents within clock generator driver circuits, and also by increasing a control node AC impedance of certain transfer capacitor coupling switches. A single-phase clock may be used to control as many as all active switches within a charge pump, and capacitive coupling may simplify biasing and timing for clock signals controlling transfer capacitor coupling switches. Any combination of such aspects of the method or apparatus may be employed to quiet and/or simplify charge pump designs over a wide range of charge pump architectures.

9 Claims, 4 Drawing Sheets

Related U.S. Application Data continuation of application No. 14/883,525, filed on Oct. 14, 2015, now Pat. No. 10,148,255, which is a continuation of application No. 13/769,780, filed on Feb. 18, 2013, now Pat. No. 9,190,902, which is a continuation of application No. 12/799,583, filed on Apr. 27, 2010, now Pat. No. 8,378,736, which is a division of application No. 10/658,154, filed on Sep. 8, 2003, now Pat. No. 7,719,343.

(51) Int. Cl.
  *G05F 3/16* (2006.01)
  *H03B 5/00* (2006.01)
  *H03K 3/013* (2006.01)
  *H03K 3/03* (2006.01)

(56) References Cited

U.S. PATENT DOCUMENTS

| | | | |
|---|---|---|---|
| 3,731,112 A | 5/1973 | Smith | |
| 3,878,450 A | 4/1975 | Greatbatch | |
| 3,942,047 A | 3/1976 | Buchanan | |
| 3,943,428 A | 3/1976 | Whidden | |
| 3,955,353 A | 5/1976 | Astle | |
| 3,975,671 A | 8/1976 | Stoll | |
| 3,995,228 A | 11/1976 | Pass et al. | |
| 4,047,091 A | 9/1977 | Hutchines et al. | |
| 4,061,929 A | 12/1977 | Asano | |
| 4,068,295 A | 1/1978 | Portmann | |
| 4,106,086 A | 8/1978 | Holbrook et al. | |
| 4,186,436 A | 1/1980 | Ishiwatari | |
| 4,316,101 A | 2/1982 | Minner | |
| 4,321,661 A | 3/1982 | Sane | |
| 4,344,050 A | 8/1982 | Callahan | |
| 4,374,357 A | 2/1983 | Olesin et al. | |
| 4,388,537 A | 6/1983 | Kanuma | |
| 4,390,798 A | 6/1983 | Kurafuji | |
| 4,460,952 A | 7/1984 | Risinger | |
| RE31,749 E | 11/1984 | Yamashiro | |
| 4,485,433 A | 11/1984 | Topich | |
| 4,575,644 A | 3/1986 | Leslie | |
| 4,621,315 A | 11/1986 | Vaughn et al. | |
| 4,633,106 A | 12/1986 | Backes et al. | |
| 4,638,184 A | 1/1987 | Kimura | |
| 4,679,134 A | 7/1987 | Bingham | |
| 4,703,196 A | 10/1987 | Arakawa | |
| 4,736,169 A | 4/1988 | Weaver et al. | |
| 4,739,191 A | 4/1988 | Puar | |
| 4,746,960 A | 5/1988 | Valeri et al. | |
| 4,752,699 A | 6/1988 | Cranford, Jr. et al. | |
| 4,769,784 A | 9/1988 | Doluca et al. | |
| 4,777,577 A | 10/1988 | Bingham et al. | |
| 4,797,899 A | 1/1989 | Fuller | |
| 4,839,787 A | 6/1989 | Kojima et al. | |
| 4,847,519 A | 7/1989 | Wahl et al. | |
| 4,891,609 A | 1/1990 | Eilley | |
| 4,897,774 A | 1/1990 | Bingham et al. | |
| 4,918,336 A | 4/1990 | Graham et al. | |
| 5,023,465 A | 6/1991 | Douglas et al. | |
| 5,023,494 A | 6/1991 | Tsukii et al. | |
| 5,029,282 A | 7/1991 | Ito | |
| 5,032,799 A | 7/1991 | Milberger et al. | |
| 5,036,229 A | 7/1991 | Tran | |
| 5,038,325 A | 8/1991 | Douglas et al. | |
| 5,061,907 A | 10/1991 | Rasmussen | |
| 5,068,626 A | 11/1991 | Takagi et al. | |
| 5,075,572 A | 12/1991 | Poteet et al. | |
| 5,093,586 A | 3/1992 | Asari | |
| 5,111,375 A | 3/1992 | Marshall | |
| 5,124,571 A | 6/1992 | Gillingham et al. | |
| 5,126,590 A | 6/1992 | Chern | |
| 5,138,190 A | 8/1992 | Yamazaki et al. | |
| 5,146,178 A | 9/1992 | Nojima et al. | |
| 5,081,371 A | 11/1992 | Wong | |
| 5,180,928 A | 1/1993 | Choi | |
| 5,182,529 A | 1/1993 | Chern | |
| 5,193,198 A | 3/1993 | Yokouchi | |
| 5,196,996 A | 3/1993 | Oh | |
| 5,208,557 A | 5/1993 | Kersh | |
| 5,212,456 A | 5/1993 | Kovalcik et al. | |
| 5,216,588 A | 6/1993 | Bajwa et al. | |
| 5,274,343 A | 12/1993 | Russell et al. | |
| 5,289,137 A | 2/1994 | Nodar et al. | |
| 5,306,954 A | 4/1994 | Chan et al. | |
| 5,317,181 A | 5/1994 | Tyson | |
| 5,349,306 A | 9/1994 | Apel | |
| 5,392,186 A | 2/1995 | Alexander et al. | |
| 5,392,205 A | 2/1995 | Zavaleta | |
| 5,394,372 A | 2/1995 | Tanaka et al. | |
| 5,408,140 A | 4/1995 | Kawai et al. | |
| 5,418,499 A | 5/1995 | Nakao | |
| 5,422,586 A | 6/1995 | Tedrow et al. | |
| 5,446,418 A | 8/1995 | Hara et al. | |
| 5,455,794 A | 10/1995 | Javanifard et al. | |
| 5,465,061 A | 11/1995 | Dufour | |
| 5,483,434 A | 1/1996 | Seesink | |
| 5,493,249 A | 2/1996 | Manning | |
| 5,519,360 A | 5/1996 | Keeth | |
| 5,535,160 A | 7/1996 | Yamaguchi | |
| 5,546,031 A | 8/1996 | Seesink | |
| 5,553,021 A | 9/1996 | Kubono et al. | |
| 5,554,892 A | 9/1996 | Norimatsu | |
| 5,589,793 A | 12/1996 | Kassapian | |
| 5,600,281 A | 2/1997 | Mori et al. | |
| 5,670,907 A | 9/1997 | Gorecki et al. | |
| 5,672,992 A | 9/1997 | Nadd | |
| 5,677,649 A | 10/1997 | Martin | |
| 5,677,650 A | 10/1997 | Kwasniewski et al. | |
| 5,689,213 A | 11/1997 | Sher | |
| 5,694,308 A | 12/1997 | Cave | |
| 5,698,877 A | 12/1997 | Gonzalez | |
| 5,729,039 A | 3/1998 | Beyer et al. | |
| 5,734,291 A * | 3/1998 | Tasdighi | H02H 3/07 327/536 |
| 5,757,170 A | 5/1998 | Pinney | |
| 5,774,404 A | 6/1998 | Eto | |
| 5,786,617 A | 7/1998 | Merrill et al. | |
| 5,793,246 A | 8/1998 | Vest et al. | |
| 5,808,505 A | 9/1998 | Tsukada | |
| 5,812,939 A | 9/1998 | Kohama | |
| 5,818,289 A | 10/1998 | Chevallier et al. | |
| 5,818,766 A | 10/1998 | Song | |
| 5,864,328 A | 1/1999 | Kajimoto | |
| 5,874,849 A | 2/1999 | Marotta et al. | |
| 5,878,331 A | 3/1999 | Yamamoto et al. | |
| 5,889,428 A | 3/1999 | Young | |
| 5,892,400 A | 4/1999 | van Saders et al. | |
| 5,917,362 A | 6/1999 | Kohama | |
| 5,945,867 A | 8/1999 | Uda et al. | |
| 5,945,879 A | 8/1999 | Rodwell et al. | |
| 5,959,335 A | 9/1999 | Bryant et al. | |
| 5,969,571 A | 10/1999 | Swanson | |
| 5,969,988 A | 10/1999 | Tanzawa et al. | |
| 5,986,649 A | 11/1999 | Yamazaki | |
| 6,020,781 A | 2/2000 | Fujioka | |
| 6,020,848 A | 2/2000 | Wallace et al. | |
| 6,064,253 A | 5/2000 | Faulkner et al. | |
| 6,064,275 A | 5/2000 | Yamauchi | |
| 6,064,872 A | 5/2000 | Vice | |
| 6,081,165 A | 6/2000 | Goldman | |
| 6,094,103 A | 7/2000 | Jeong et al. | |
| 6,107,885 A | 8/2000 | Miguelez et al. | |
| 6,122,185 A | 9/2000 | Utsunomiya | |
| 6,130,572 A | 10/2000 | Ghilardelli et al. | |
| 6,137,367 A | 10/2000 | Ezzedine et al. | |
| 6,169,444 B1 | 1/2001 | Thurber | |
| 6,188,590 B1 | 2/2001 | Chang et al. | |
| 6,195,307 B1 | 2/2001 | Umezawa et al. | |
| RE37,124 E | 4/2001 | Monk et al. | |
| 6,223,990 B1 | 5/2001 | Kamei | |
| 6,226,206 B1 | 5/2001 | Maeda | |
| 6,249,446 B1 | 6/2001 | Shearon et al. | |
| 6,275,096 B1 | 8/2001 | Hsu | |

(56) References Cited

U.S. PATENT DOCUMENTS

| | | |
|---|---|---|
| 6,297,687 B1 | 10/2001 | Sugimura |
| 6,308,047 B1 | 10/2001 | Yamamoto et al. |
| 6,337,594 B1 | 1/2002 | Hwang |
| 6,339,349 B1 | 1/2002 | Rajagopalan |
| 6,356,062 B1 | 3/2002 | Elmhurst et al. |
| 6,400,211 B1 | 6/2002 | Yokomizo |
| 6,411,531 B1 | 6/2002 | Nork et al. |
| 6,414,863 B1 | 7/2002 | Bayer et al. |
| 6,424,585 B1 | 7/2002 | Ooishi |
| 6,429,632 B1 | 8/2002 | Forbes et al. |
| 6,429,723 B1 | 8/2002 | Hastings |
| 6,429,732 B1 | 8/2002 | Tedrow et al. |
| 6,452,232 B1 | 9/2002 | Adan |
| 6,486,728 B2 | 11/2002 | Kleveland |
| 6,486,729 B2 | 11/2002 | Imamiya |
| 6,496,074 B1 | 12/2002 | Sowlati |
| 6,504,213 B1 | 1/2003 | Ebina |
| 6,518,829 B2 | 2/2003 | Butler |
| 6,535,071 B2 | 3/2003 | Forbes |
| 6,537,861 B1 | 3/2003 | Kroell et al. |
| 6,559,689 B1 | 5/2003 | Clark |
| 6,560,164 B2 | 5/2003 | Kawai |
| 6,563,366 B1 | 5/2003 | Kohama |
| 6,617,933 B2 * | 9/2003 | Ito .................... H03L 7/093 331/25 |
| 6,653,697 B2 | 11/2003 | Hidaka et al. |
| 6,661,682 B2 | 12/2003 | Kim |
| 6,661,683 B2 | 12/2003 | Botker |
| 6,664,861 B2 | 12/2003 | Murakami |
| 6,677,641 B2 | 1/2004 | Kocon |
| 6,714,065 B2 | 3/2004 | Komiya et al. |
| 6,717,458 B1 | 4/2004 | Potanin |
| 6,737,926 B2 | 5/2004 | Forbes |
| 6,744,224 B2 | 6/2004 | Ishii |
| 6,784,737 B2 | 8/2004 | Martin et al. |
| 6,788,130 B2 | 9/2004 | Pauletti et al. |
| 6,788,578 B1 | 9/2004 | Tang |
| 6,794,927 B2 | 9/2004 | Bedarida et al. |
| 6,801,076 B1 | 10/2004 | Merritt |
| 6,803,807 B2 | 10/2004 | Fujiyama et al. |
| 6,806,761 B1 | 10/2004 | Aude |
| 6,809,603 B1 | 10/2004 | Ho |
| 6,812,775 B2 | 11/2004 | Seo |
| 6,816,000 B2 | 11/2004 | Miyamitsu |
| 6,816,001 B2 | 11/2004 | Khouri et al. |
| 6,816,016 B2 | 11/2004 | Sander et al. |
| 6,819,187 B1 | 11/2004 | Ming et al. |
| 6,819,938 B2 | 11/2004 | Sahota |
| 6,825,699 B2 | 11/2004 | Marshall et al. |
| 6,825,730 B1 | 11/2004 | Sun |
| 6,828,614 B2 | 12/2004 | Gonzalez |
| 6,831,499 B2 | 12/2004 | Oddone et al. |
| 6,831,847 B2 | 12/2004 | Perry |
| 6,833,745 B2 | 12/2004 | Hausmann et al. |
| 6,833,752 B2 | 12/2004 | Merritt et al. |
| 6,836,173 B1 | 12/2004 | Yang |
| 6,836,176 B2 | 12/2004 | Zeng et al. |
| 6,844,762 B2 | 1/2005 | Sanchez |
| 6,847,251 B2 | 1/2005 | Kao et al. |
| 6,853,566 B2 | 2/2005 | Itoh |
| 6,855,655 B2 | 2/2005 | Wagner et al. |
| 6,856,177 B1 | 2/2005 | de Frutos et al. |
| 6,871,059 B1 | 3/2005 | Piro et al. |
| 6,879,502 B2 | 4/2005 | Yoshida et al. |
| 6,891,234 B1 | 5/2005 | Connelly et al. |
| 6,897,708 B2 | 5/2005 | Hamasako |
| 6,906,575 B2 | 6/2005 | Tanaka |
| 6,947,720 B2 | 9/2005 | Razavi et al. |
| 6,954,623 B2 | 10/2005 | Chang et al. |
| 6,967,523 B2 | 11/2005 | DeMone |
| 6,968,020 B1 | 11/2005 | Jayaraman |
| 7,023,260 B2 | 4/2006 | Thorp et al. |
| 7,042,245 B2 | 5/2006 | Hidaka |
| 7,068,096 B2 | 6/2006 | Chu |
| 7,068,114 B2 | 6/2006 | Nishiyama |
| 7,102,449 B1 | 9/2006 | Mohan |
| 7,109,532 B1 | 9/2006 | Lee et al. |
| 7,123,898 B2 | 10/2006 | Burgener et al. |
| 7,126,595 B2 | 10/2006 | Yanagi |
| 7,129,796 B2 | 10/2006 | Goto |
| 7,161,197 B2 | 1/2007 | Nakatsuka et al. |
| 7,180,794 B2 | 2/2007 | Matsue |
| 7,202,712 B2 | 4/2007 | Athas |
| 7,212,788 B2 | 5/2007 | Weber et al. |
| 7,256,642 B2 | 8/2007 | Kimura |
| 7,355,455 B2 | 4/2008 | Hidaka |
| 7,359,677 B2 | 4/2008 | Huang et al. |
| 7,382,176 B2 | 6/2008 | Ayres et al. |
| 7,391,282 B2 | 6/2008 | Nakatsuka et al. |
| 7,430,133 B1 | 9/2008 | McIntyre et al. |
| 7,457,594 B2 | 11/2008 | Theobold et al. |
| 7,460,852 B2 | 12/2008 | Burgener et al. |
| 7,486,128 B2 | 2/2009 | Yen et al. |
| 7,515,882 B2 | 4/2009 | Kelcourse et al. |
| 7,532,061 B2 | 5/2009 | Ragone et al. |
| 7,546,089 B2 | 6/2009 | Bellantoni |
| 7,551,036 B2 | 6/2009 | Berroth et al. |
| 7,560,977 B2 | 7/2009 | Miyazaki et al. |
| 7,570,104 B2 | 8/2009 | Hsu |
| 7,649,403 B2 | 1/2010 | Lee et al. |
| 7,659,152 B2 | 2/2010 | Gonzalez et al. |
| 7,667,529 B2 | 2/2010 | Consuelo et al. |
| 7,719,343 B2 * | 5/2010 | Burgener ............ H02M 3/07 327/536 |
| 7,724,070 B2 | 5/2010 | Fukami |
| 7,724,072 B2 | 5/2010 | Baek et al. |
| 7,733,156 B2 | 6/2010 | Brederlow et al. |
| 7,733,157 B2 | 6/2010 | Brederlow et al. |
| 7,741,869 B2 | 6/2010 | Hidaka |
| 7,756,494 B2 | 7/2010 | Fujioka et al. |
| 7,786,807 B1 | 8/2010 | Li et al. |
| 7,796,969 B2 | 9/2010 | Kelly et al. |
| 7,817,966 B2 | 10/2010 | Prikhodko et al. |
| 7,860,499 B2 | 12/2010 | Burgener et al. |
| 7,868,683 B2 | 1/2011 | Ilkov |
| 7,910,993 B2 | 3/2011 | Brindle et al. |
| 7,928,759 B2 | 4/2011 | Hidaka |
| 7,928,796 B2 | 4/2011 | Namekawa |
| 7,936,213 B2 | 5/2011 | Shin et al. |
| 7,944,277 B1 | 5/2011 | Sinitsky et al. |
| 7,956,675 B2 | 6/2011 | Saitoh et al. |
| 7,969,235 B2 | 6/2011 | Pan |
| 7,982,265 B2 | 7/2011 | Challa et al. |
| 8,040,175 B2 | 10/2011 | Raghavan |
| 8,067,977 B2 | 11/2011 | Joo |
| 8,072,258 B2 | 12/2011 | Yamahira |
| 8,103,226 B2 | 1/2012 | Andrys et al. |
| 8,131,251 B2 | 3/2012 | Burgener et al. |
| 8,195,103 B2 | 6/2012 | Waheed et al. |
| 8,253,494 B2 | 8/2012 | Biednov |
| 8,339,185 B2 | 12/2012 | Cazzaniga et al. |
| 8,378,736 B2 * | 2/2013 | Burgener ............ H02M 3/073 327/536 |
| 8,497,670 B1 | 7/2013 | Molin et al. |
| 8,559,907 B2 | 10/2013 | Burgener et al. |
| 8,649,741 B2 | 2/2014 | Iijima et al. |
| 8,649,754 B2 | 2/2014 | Burgener et al. |
| 8,674,749 B2 | 3/2014 | Tran et al. |
| 8,686,787 B2 | 4/2014 | Swonger |
| 8,816,659 B2 | 8/2014 | Kim et al. |
| 8,954,902 B2 | 2/2015 | Stuber et al. |
| 8,994,452 B2 | 3/2015 | Kim et al. |
| 8,995,154 B2 | 3/2015 | Kaneda |
| 9,030,248 B2 | 5/2015 | Kim et al. |
| 9,087,899 B2 | 7/2015 | Brindle et al. |
| 9,106,072 B2 | 8/2015 | Khatri |
| 9,154,027 B2 | 10/2015 | Huynh et al. |
| 9,190,902 B2 * | 11/2015 | Burgener ............ H03K 3/013 |
| 9,225,378 B2 | 12/2015 | Burgener et al. |
| 9,252,651 B2 | 2/2016 | Mott |
| 9,264,053 B2 | 2/2016 | Englekirk |
| 9,276,526 B2 | 3/2016 | Nobbe |
| 9,312,822 B2 | 4/2016 | Knopik |
| 9,312,909 B2 | 4/2016 | Kang et al. |

(56) References Cited

U.S. PATENT DOCUMENTS

| | | |
|---|---|---|
| 9,354,654 B2 | 5/2016 | Swonger |
| 9,369,087 B2 | 6/2016 | Burgener et al. |
| 9,385,669 B2 | 7/2016 | Banerjee |
| 9,397,656 B2 | 7/2016 | Dribinsky et al. |
| 9,413,362 B2 | 8/2016 | Englekirk |
| 9,419,560 B2 | 8/2016 | Korol |
| 9,429,969 B2 | 8/2016 | Kim et al. |
| 9,531,413 B2 | 12/2016 | Sun et al. |
| 9,577,626 B2 | 2/2017 | Crandall |
| 9,584,097 B2 | 2/2017 | Bakalski |
| 9,590,614 B2 | 3/2017 | Cebi |
| 9,654,094 B2 | 5/2017 | Ishimaru et al. |
| 9,660,590 B2 | 5/2017 | Kim et al. |
| 9,680,416 B2 | 6/2017 | Burgener et al. |
| 9,685,963 B2 | 6/2017 | Englekirk |
| 9,768,683 B2 | 9/2017 | Englekirk |
| 9,778,669 B2 | 10/2017 | Kim et al. |
| 9,793,795 B2 | 10/2017 | Englekirk |
| 9,871,512 B2 | 1/2018 | Ho |
| 9,882,531 B1 | 1/2018 | Willard |
| 9,948,252 B1 | 4/2018 | Adamski |
| 9,966,988 B2 | 5/2018 | Burgener et al. |
| 9,998,002 B2 | 6/2018 | Englekirk |
| 10,097,171 B2 | 10/2018 | Li |
| 10,148,255 B2 * | 12/2018 | Burgener ............ H02M 3/073 |
| 10,236,872 B1 | 3/2019 | Willard et al. |
| 10,243,519 B2 | 3/2019 | Dykstra |
| 10,250,131 B2 | 4/2019 | Kim et al. |
| 10,587,229 B1 | 3/2020 | Costa |
| 10,608,617 B2 * | 3/2020 | Burgener ............ H03K 3/013 |
| 2001/0031518 A1 | 10/2001 | Kim et al. |
| 2002/0079971 A1 | 6/2002 | Vathulya |
| 2002/0115244 A1 | 8/2002 | Park et al. |
| 2002/0140412 A1 | 10/2002 | Maneatis |
| 2002/0153940 A1 | 10/2002 | Wurcer et al. |
| 2003/0002452 A1 | 1/2003 | Sahota |
| 2003/0141543 A1 | 7/2003 | Bryant et al. |
| 2003/0201494 A1 | 10/2003 | Maeda et al. |
| 2004/0061130 A1 | 4/2004 | Morizuka |
| 2004/0080364 A1 | 4/2004 | Sander et al. |
| 2004/0129975 A1 | 7/2004 | Koh et al. |
| 2004/0204013 A1 | 10/2004 | Ma et al. |
| 2005/0052220 A1 | 3/2005 | Burgener et al. |
| 2005/0077564 A1 | 4/2005 | Forbes |
| 2005/0121699 A1 | 6/2005 | Chen et al. |
| 2005/0122163 A1 | 6/2005 | Chu |
| 2006/0114731 A1 | 6/2006 | Park |
| 2006/0194558 A1 | 8/2006 | Kelly |
| 2006/0281418 A1 | 12/2006 | Huang et al. |
| 2006/0284670 A1 | 12/2006 | Eid et al. |
| 2007/0018247 A1 | 1/2007 | Brindle et al. |
| 2007/0045697 A1 | 3/2007 | Driesch, Jr. et al. |
| 2007/0069801 A1 | 3/2007 | Ragone et al. |
| 2007/0075784 A1 | 4/2007 | Pettersson |
| 2007/0146064 A1 | 6/2007 | Morie et al. |
| 2007/0279120 A1 | 12/2007 | Brederlow et al. |
| 2008/0007980 A1 | 1/2008 | Fujiwara |
| 2008/0044041 A1 | 2/2008 | Tucker et al. |
| 2008/0076371 A1 | 3/2008 | Dribinsky et al. |
| 2008/0116979 A1 | 5/2008 | Lesso et al. |
| 2008/0272833 A1 | 11/2008 | Ivanov et al. |
| 2008/0298605 A1 | 12/2008 | Fan et al. |
| 2009/0066407 A1 | 3/2009 | Bowman et al. |
| 2009/0140795 A1 | 6/2009 | Choy |
| 2010/0033226 A1 | 2/2010 | Kim et al. |
| 2010/0052771 A1 | 3/2010 | Hartono |
| 2010/0110736 A1 | 5/2010 | Gronthal et al. |
| 2010/0214010 A1 | 8/2010 | Burgener et al. |
| 2010/0245327 A1 | 9/2010 | Tsujino et al. |
| 2010/0330938 A1 | 12/2010 | Yin |
| 2011/0156819 A1 | 6/2011 | Kim et al. |
| 2011/0163779 A1 | 7/2011 | Hidaka |
| 2011/0169550 A1 | 7/2011 | Brindle et al. |
| 2011/0299437 A1 | 12/2011 | Mikhemar et al. |
| 2012/0007679 A1 | 1/2012 | Burgener et al. |
| 2012/0038344 A1 | 2/2012 | Kim et al. |
| 2012/0064952 A1 | 3/2012 | Iijima et al. |
| 2012/0139643 A1 | 6/2012 | Scott |
| 2012/0200338 A1 | 8/2012 | Olson |
| 2012/0242379 A1 | 9/2012 | Obkircher et al. |
| 2012/0286854 A1 | 11/2012 | Swonger |
| 2013/0015717 A1 | 1/2013 | Dykstra |
| 2013/0082782 A1 | 4/2013 | Leuschner |
| 2013/0148456 A1 | 6/2013 | Cho et al. |
| 2013/0229841 A1 | 9/2013 | Giuliano |
| 2013/0293280 A1 | 11/2013 | Brindle et al. |
| 2013/0310114 A1 | 11/2013 | Zohny |
| 2013/0320955 A1 | 12/2013 | Kratyuk et al. |
| 2014/0028521 A1 | 1/2014 | Bauder et al. |
| 2014/0055194 A1 | 2/2014 | Burgener et al. |
| 2014/0085006 A1 | 3/2014 | Mostov et al. |
| 2014/0087673 A1 | 3/2014 | Mostov et al. |
| 2014/0179249 A1 | 6/2014 | Burgener et al. |
| 2014/0306767 A1 | 10/2014 | Burgener et al. |
| 2015/0002195 A1 | 1/2015 | Englekirk |
| 2015/0002214 A1 | 1/2015 | Englekirk |
| 2015/0084610 A1 | 3/2015 | Kim et al. |
| 2015/0280655 A1 | 10/2015 | Nobbe |
| 2016/0126835 A1 | 5/2016 | Englekirk |
| 2016/0126906 A1 | 5/2016 | Maxim |
| 2016/0179114 A1 | 6/2016 | Kim et al. |
| 2016/0191022 A1 | 6/2016 | Burgener et al. |
| 2016/0285363 A1 | 9/2016 | Englekirk |
| 2017/0098996 A1 | 4/2017 | Englekirk |
| 2017/0149437 A1 | 5/2017 | Luo |
| 2017/0237462 A1 | 8/2017 | Burgener et al. |
| 2018/0046210 A1 | 2/2018 | Kim et al. |
| 2018/0091045 A1 | 3/2018 | Englekirk |
| 2020/0007088 A1 | 1/2020 | Ranta |

FOREIGN PATENT DOCUMENTS

| | | |
|---|---|---|
| EP | 0622901 | 11/1994 |
| EP | 0 938 094 A1 | 1/1999 |
| EP | 2421132 | 2/2012 |
| EP | 1664966 | 7/2014 |
| EP | 1774620 | 10/2014 |
| EP | 2830203 | 1/2015 |
| EP | 2884586 | 6/2015 |
| GB | 2451524 | 2/2009 |
| JP | 55-75348 | 6/1980 |
| JP | 01-254014 | 11/1989 |
| JP | 04-34980 | 2/1992 |
| JP | 04-334105 | 11/1992 |
| JP | 05-111241 | 4/1993 |
| JP | 06-152334 | 5/1994 |
| JP | 06-314985 | 11/1994 |
| JP | 06-334506 | 12/1994 |
| JP | 08-148949 | 6/1996 |
| JP | 08-307305 | 11/1996 |
| JP | 09-161472 | 6/1997 |
| JP | 09-200021 | 7/1997 |
| JP | 10-93471 | 4/1998 |
| JP | 10-242477 | 9/1998 |
| JP | 10-242829 | 9/1998 |
| JP | 10-344247 | 12/1998 |
| JP | 11-136111 | 5/1999 |
| JP | 11-252900 | 9/1999 |
| JP | 2000-166220 | 6/2000 |
| JP | 2000166220 | 6/2000 |
| JP | 2001-051758 | 2/2001 |
| JP | 2001-119281 | 4/2001 |
| JP | 2001-119927 | 4/2001 |
| JP | 2002-119053 | 4/2002 |
| JP | 03-060451 | 2/2003 |
| JP | 03-198248 | 7/2003 |
| JP | 2004-147175 | 5/2004 |
| JP | 2005-057860 | 3/2005 |
| JP | 2006-352326 | 12/2006 |
| JP | 5675529 | 1/2015 |
| JP | 57779166 | 7/2015 |
| WO | WO 95/23460 A1 | 8/1995 |

(56) References Cited

FOREIGN PATENT DOCUMENTS

| WO | WO98/58382 | 12/1998 |
|---|---|---|
| WO | 2009/063661 | 5/2009 |
| WO | 2010/008586 | 1/2010 |

OTHER PUBLICATIONS

Tran, Pablo No., Notice of Allowance received from the USPTO dated Feb. 15, 2013 for related U.S. Appl. No. 12/903,848, 26 pgs.
Mehari, Yemane, Office Action received from the USPTO dated Mar. 15, 2015 for related U.S. Appl. No. 13/016,875, 83 pgs.
Kim, et al., Amendment—Response to Restriction filed in the USPTO dated Apr. 15, 2013 for related U.S. Appl. No. 13/054,781, 5 pgs.
Nguyen, Hieu P., Office Action received from USPTO dated Jun. 11, 2013 for related U.S. Appl. No. 13/054,781, 45 pgs.
Swonger, James, Response filed in the USPTO dated Jun. 12, 2013 for related U.S. Appl. No. 13/105,743, 21 pgs.
Kim, et al., Amendment filed in the USPTO dated Jul. 12, 2013 for related U.S. Appl. No. 13/016,875, 8 pgs.
Tokuda, Kenji, Office Action and English Translation received from the Japanese Patent Office dated Jul. 13, 2013 for related appln. No. 2011-518737, 10 pgs.
Wells, Kenneth B., Notice of Allowance received from the USPTO dated Jul. 24, 2013 for related U.S. Appl. No. 13/105,743, 10 pgs.
Sasaki, Satoshi, English translation of Office Action received from the Japanese Patent Office dated Jul. 23, 2013 for related appln. No. 2011-171908, 2 pgs.
Mehari, Yemane, Notice of Allowance received from the USPTO dated Aug. 20, 2013 for related U.S. Appl. No. 13/016,875, 17 pgs.
Tran, Pablo N. Notice of Allowance received from the USPTO dated Aug. 28, 2013 for related U.S. Appl. No. 12/903,848, 18 pgs.
Muelemans, Bart, Extended Search Report received from the EPO dated Oct. 22, 2013 for related appln. No. 11154275.9, 6 pgs.
Wells, Kenneth B., Notice of Allowance received from the USPTO dated Nov. 7, 2013 for related U.S. Appl. No. 13/105,743, 11 pgs.
Le, Dinh Thanh, Notice of Allowance received from the USPTO dated Nov. 7, 2013 for related U.S. Appl. No. 12/460,442, 16 pgs.
Gentili, Luigi, Communication under Rule 71(3) EPC received from the EPO dated Nov. 14, 2013 for related appln. No. 04816848.8, 43 pgs.
European Patent Office, Communication pursuant to Rule 69 EPC received from the EPO dated Nov. 25, 2013 for related appln. No. 11154275.9, 2 pgs.
Mehari, Yeman, Notice of Allowance received from the USPTO dated Jan. 2, 2014 for related U.S. Appl. No. 13/016,875, 15 pgs.
Meulemans, Bart, Supplementary European Search Report received from the EPO dated Jan. 22, 2014 for related appln. No. E09798318, 6 pgs.
Moon, et al., "Design of a Low-Distortion 22-kHz Fifth-Order Bessel Filter", IEEE Journal of Solid State Circuits, 28(1993) December, No. 12, New York, US, pp. 1254-1263.
Matsumoto, Yasunori, English Translation of Office Action of Japan Patent Office dated Feb. 4, 2014 for related appln. No. 2012-243547, 2 pgs.
Peregrine Semiconductor Corporation, Response filed in the EPO dated Jan. 8, 2014 for related appln. No. 04816848.8, 13 pgs.
European Patent Office, Communication pursuant to Rules 90(2) and 70a(2) EPC received from EPO dated Feb. 14, 2014 for related appln. No. 09798318.3, 1 pg.
Gundlach, Susanne, Communication under Rule 71(3) EPC received from the EPO dated Feb. 14, 2014 for related appln. No. 04816848.8, 44 pgs.
Sakurada, Masaki, Office Action and English translation of Japanese Office Action received from the JPO dated Mar. 4, 2014 for related appln. No. 2011-171908, 20 pgs.
Le, Dinh Thanh, Notice of Allowance received from the USPTO dated Mar. 12, 2014 for related U.S. Appl. No. 12/460,442, 12 pgs.

Nguyen, Hieu P., Notice of Allowance received from the USPTO dated Mar. 13, 2014 for related U.S. Appl. No. 13/054,781, 19 pgs.
Mehari, Yemane, Notice of Allowance received from the USPTO dated Apr. 14, 2014 for related U.S. Appl. No. 13/016,875, 12 pgs.
Toscano, Oliveros, Communication under Rule 71(3) EPC dated Apr. 25, 2014 for related appln. No. 05763216.8, 47 pgs.
Peregrine Semiconductor Corporation, English translation of Response filed in the JPO filed Apr. 28, 2014 for related appln. No. 2012-243547, 5 pgs.
Tran, Pablo, Office Action received from the USPTO dated May 8, 2014 for related U.S. Appl. No. 14/052,680, 5 pgs.
Peregrine Semiconductor Corporation, Response filed in the EPO dated May 9, 2014 for related appln. No. 11154275.9, 4 pgs.
Hiltunen, Thomas J., Office Action received from the USPTO dated May 22, 2014 for related U.S. Appl. No. 13/933,006, 10 pgs.
Englund, Terry Lee, Office Action received from the USPTO dated May 23, 2014 for related U.S. Appl. No. 13/932,996, 13 pgs.
Englund, Terry Lee, Notice of Allowance received from the USPTO dated May 4, 2015 for U.S. Appl. No. 13/769,780, 28 pgs.
Englund, Terry Lee, Notice of Allowance received from the USPTO dated Sep. 4, 2015 for U.S. Appl. No. 13/769,780, 9 pgs.
Burgener, et al., Response filed in the USPTO dated Jun. 3, 2014 for U.S. Appl. No. 13/769,780, 17 pgs.
Burgener, et al., Response After Final Office Action filed in the USPTO dated Dec. 18, 2014 for U.S. Appl. No. 13/769,780, 21 pgs.
Peregrine Semiconductor Corporation, Response filed in the EPO dated Jun. 8, 2016 for appln. No. 09798318.3, 14 pgs.
Englekirk, Robert Mark, Amendment filed in the USPTO dated Jun. 10, 2016 for U.S. Appl. No. 14/991,577, 20 pgs.
Kim, et al., Response to Non-Final Office Action filed in the USPTO dated Jun. 23, 2016 for U.S. Appl. No. 14/638,954, 15 pgs.
Mehari, Yemane, Notice of Allowance received from the USPTO dated Jul. 21, 2016 for U.S. Appl. No. 14/462,193, 12 pgs.
Hiltunen, Thomas, Final Office Action received from the USPTO dated Aug. 1, 2016 for U.S. Appl. No. 14/991,577, 17 pgs.
Skibinski, Thomas, Office Action received from the USPTO dated Aug. 23, 2016 for U.S. Appl. No. 15/179,416, 28 pgs.
Nguyen, Hieu P., Office Action received from the USPTO dated Sep. 16, 2016 for U.S. Appl. No. 14/638,954, 19 pgs.
Englekirk, Robert Mark, Response After Final Office Action filed in the USPTO dated Oct. 31, 2016 for U.S. Appl. No. 14/991,577, 14 pgs.
Hiltunen, Thomas J., Notice of Allowance received from the USPTO dated Nov. 18, 2016 for U.S. Appl. No. 14/991,577, 11 pgs.
Englekirk, Robert Mark, Response filed in the USPTO dated Nov. 18, 2016 for U.S. Appl. No. 15/179,416, 17 pgs.
Nguyen, Hieu P., Notice of Allowance received from the USPTO dated Jan. 12, 2017 for U.S. Appl. No. 14/638,954, 14 pgs.
Tran, Pablo N., Notice of Allowance received from the USPTO dated Feb. 3, 2017 for U.S. Appl. No. 14/052,680, 157 pgs.
Skibinski, Thomas S., Office Action received from the USPTO dated Mar. 2, 2017 for U.S. Appl. No. 15/179,416, 52 pgs.
Hiltunen, Thomas J., Notice of Allowance received from the USPTO dated Mar. 22, 2017 for U.S. Appl. No. 14/991,577, 9 pgs.
Mehari, Yemane, Office Action received from the USPTO dated Mar. 22, 2017 for U.S. Appl. No. 15/059,206, 35 pgs.
Hiltunen, Thomas J., Office Action received from the USPTO dated Mar. 27, 2017 for U.S. Appl. No. 15/382,483, 15 pgs.
Kim, et al., Response to Office Action filed in the USPTO dated Mar. 29, 2017 for U.S. Appl. No. 15/059,206, 4 pgs.
Englekirk, Robert Mark, Response filed in the USPTO dated Mar. 30, 2017 for U.S. Appl. No. 15/179,416, 16 pgs.
Skibinski, Thomas S., Notice of Allowance received from the USPTO dated Jun. 22, 2017 for U.S. Appl. No. 15/179,416, 14 pgs.
Hiltunen, Thomas J., Notice of Allowance received from the USPTO dated May 10, 2017 for U.S. Appl. No. 14/991,577, 10 pgs.
Englekirk, Robert Mark, Response filed in the USPTO dated Jun. 21, 2017 for U.S. Appl. No. 15/382,483, 11 pgs.
Skibinski, Thomas S., Notice of Allowance received from the USPTO dated Apr. 24, 2017 for U.S. Appl. No. 15/179,416, 15 pgs.
Mehari, Yemane, Notice of Allowance received from the USPTO dated Jul. 18, 2017 for U.S. Appl. No. 15/059,206, 51 pgs.

(56) References Cited

OTHER PUBLICATIONS

Hiltunen, Thomas J., Notice of Allowance received from the USPTO dated Aug. 17, 2017 for U.S. Appl. No. 15/382,483, 20 pgs.
Tran, Pablo N., Office Action received from the USPTO dated Aug. 18, 2017 for U.S. Appl. No. 15/586,007, 5 pgs.
Burgener, et al., Response filed in the USPTO dated Sep. 5, 2017 for U.S. Appl. No. 15/586,007, 8 pgs.
Tran, Pablo N., Office Action received from the USPTO dated Sep. 27, 2017 for U.S. Appl. No. 15/586,007, 11 pgs.
Burgener, et al., Response filed in the USPTO dated Oct. 11, 2017 for U.S. Appl. No. 15/586,007, 3 pgs.
Skibinski, Thomas S., Office Action received from the USPTO dated Jan. 8, 2018 for U.S. Appl. No. 15/670,945, 12 pgs.
Englekirk, Robert Mark, Response filed in the USPTO dated Jan. 10, 2018 for U.S. Appl. No. 15/670,945, 11 pgs.
Mehari, Yemane, Office Action received from the USPTO dated Feb. 20, 2018 for U.S. Appl. No. 15/688,597, 12 pgs.
Nguyen, Hieu P., Office Action received from the USPTO dated Mar. 16, 2018 for U.S. Appl. No. 15/602,042, 26 pgs.
Skibinski, Thomas S., Notice of Allowance received from the USPTO dated Mar. 28, 2018 for U.S. Appl. No. 15/670,945, 9 pgs.
Aquilani, Dario, Office Action received from the EPO dated Jul. 2, 2018 for appln. No. 14182150.4, 4 pgs.
Mehari, Yemane, Notice of Allowance received from the USPTO dated Jul. 17, 2018 for U.S. Appl. No. 15/688,597, 12 pgs.
Nguyen, Hieu P., Final Office Action received from the USPTO dated Sep. 11, 2018 for U.S. Appl. No. 15/602,042, 12 pgs.
Gentili, Luigi, Communication under Rule 71(3) EPC received from the EPO dated Sep. 6, 2018 for appln. No. 14178741.6, 29 pgs.
Englund, Terry Lee, Office Action received from the USPTO dated Dec. 6, 2013 for U.S. Appl. No. 13/769,780, 18 pgs.
Tran, Pablo N., Notice of Allowance received from the USPTO dated Jun. 14, 2019 for U.S. Appl. No. 15/917,218, 12 pgs.
Wells, Kenneth B., Office Action received from the USPTO dated May 1, 2019 for U.S. Appl. No. 16/169,831, 21 pgs.
Wells, Kenneth B., Final Office Action received from the USPTO dated Aug. 14, 2019 for U.S. Appl. No. 16/169,831, 19 pgs.
Wells, Kenneth B., Notice of Allowance received from the USPTO dated Nov. 25, 2019 for U.S. Appl. No. 16/169,831, 5 pgs.
Wells, Kenneth B., Office Action received from the USPTO dated Aug. 16, 2016 for U.S. Appl. No. 14/883,525, 25 pgs.
Wells, Kenneth B., Final Office Action received from the USPTO dated Jan. 5, 2017 for U.S. Appl. No. 14/883,525, 18 pgs.
Wells, Kenneth B., Office Action received from the USPTO dated Apr. 17, 2017 for U.S. Appl. No. 14/883,525, 13 pgs.
Wells, Kenneth B., Final Office Action received from the USPTO dated Oct. 10, 2017 for U.S. Appl. No. 14/883,525, 22 pgs.
Wells, Kenneth B., Advisory Action received from the USPTO dated Jan. 17, 2018 for U.S. Appl. No. 14/883,525, 8 pgs.
Wells, Kenneth B., Final Office Action received from the USPTO dated Feb. 22, 2018 for U.S. Appl. No. 14/883,525, 19 pgs.
Wells, Kenneth B., Final Office Action received from the USPTO dated Jul. 5, 2018 for U.S. Appl. No. 14/883,525, 22 pgs.
Wells, Kenneth B., Notice of Allowance received from the USPTO dated Aug. 30, 2018 for U.S. Appl. No. 14/883,525, 13 pgs.
Burgener, et al., Response filed in the USPTO dated Nov. 11, 2016 for U.S. Appl. No. 14/883,525, 10 pgs.
Burgener, et al., Preliminary Amendment filed in the USPTO dated Feb. 24, 2017 for U.S. Appl. No. 14/883,525, 16 pgs.
Burgener, et al., Response filed in the USPTO dated Aug. 31, 2017 for U.S. Appl. No. 14/883,525, 9 pgs.
Burgener, et al., Response filed in the USPTO dated Jan. 5, 2018 for U.S. Appl. No. 14/883,525, 10 pgs.
Burgener, et al., Response filed in the USPTO dated May 22, 2018 for U.S. Appl. No. 14/883,525, 12 pgs.
Burgener, et al., Response filed in the USPTO dated Jul. 31, 2018 for U.S. Appl. No. 14/883,525, 5 pgs.
Nguyen, Hieu P., Notice of Allowance received from the USPTO dated Dec. 7, 2018 for U.S. Appl. No. 15/602,042, 17 pgs.

Mehari, Yemane, Office Action received from the USPTO dated Mar. 20, 2019 for U.S. Appl. No. 16/143,142, 13 pgs.
Tieu, Binh Kien, Office Action received from the USPTO dated Mar. 22, 2019 for U.S. Appl. No. 16/167,389, 12 pgs.
PSemi Corporation, Preliminary Amendment filed in the USPTO dated Dec. 12, 2018 for U.S. Appl. No. 16/169,831, 9 pgs.
PSemi Corporation, Response filed in the USPTO dated Jul. 30, 2019 for U.S. Appl. No. 16/169,831, 14 pgs.
PSemi Corporation, Response filed in the USPTO dated Nov. 13, 2019 for U.S. Appl. No. 16/169,831, 9 pgs.
Skibinski, Thomas, Final Office Action received from the USPTO dated Nov. 9, 2015 for U.S. Appl. No. 13/932,996, 31 pgs.
Englekirk, Robert Mark, Response filed in the USPTO dated Oct. 27, 2015 for U.S. Appl. No. 13/932,996, 12 pgs.
Swonger, James, Amendment filed in the USPTO dated Dec. 1, 2015 for U.S. Appl. No. 14/230,945, 8 pgs.
Burgener, et al., Response filed in the USPTO dated Dec. 3, 2015 for U.S. Appl. No. 14/177,062, 9 pgs.
Meulemans, Bart, Communication pursuant to Article 94(3) EPC received from the EPO dated Dec. 17, 2015 for appln. No. 09798318.3, 4 pgs.
Nguyen, Hieu P., Office Action received from the USPTO dated Dec. 30, 2015 for U.S. Appl. No. 14/638,954, 6 pgs.
Peregrine Semiconductor Corporation, Response filed in the EPO dated Jan. 13, 2016 for appln. No. 14182150.4, 15 pgs.
Wells, Kenneth, Notice of Allowance received from the USPTO dated Jan. 21, 2016 for U.S. Appl. No. 14/230,945, 14 pgs.
Suzuki, Shigeyuki, English translation of Office Action received from the JPO dated Feb. 2, 2016 for appln. No. 2014-260387, 3 pgs.
Englekirk, Robert Mark, Amendment After Final Office Action filed in the USPTO dated Feb. 9, 2016 for U.S. Appl. No. 13/932,996, 17 pgs.
Mehari, Yemane, Notice of Allowance received from the USPTO dated Feb. 17, 2016 for U.S. Appl. No. 14/462,193, 37 pgs.
Skibinski, Thomas, Advisory Action received from the USPTO dated Feb. 23, 2016 for U.S. Appl. No. 13/932,996, 8 pgs.
Kim, et al., Response to Restriction Requirement filed in the USPTO dated Feb. 29, 2016 for U.S. Appl. No. 14/638,954, 8 pgs.
Skibinski, Thomas, Notice of Allowance received from the USPTO dated Mar. 11, 2016 for U.S. Appl. No. 13/932,996, 13 pgs.
Tran, Pablo, Notice of Allowance received from the USPTO dated Mar. 25, 2016 for U.S. Appl. No. 14/177,062, 146 pgs.
Mehari, Yemane, Notice of Allowance received from the USPTO dated Mar. 29, 2016 for U.S. Appl. No. 14/462,193, 17 pgs.
Hiltunen, Thomas, Office Action received from the USPTO dated Apr. 14, 2016 for U.S. Appl. No. 14/991,577, 13 pgs.
Swonger, James, Comments on Examiner's Statement of Reasons for Allowance filed in the USPTO dated Apr. 21, 2016 for U.S. Appl. No. 14/230,945, 4 pgs.
Peregrine Semiconductor Corporation, English translation of a Response filed in the JPO dated Apr. 28, 2016 for appln. No. 2014-260387, 9 pgs.
Nguyen, Hieu, Office Action received from the USPTO dated May 11, 2016 for U.S. Appl. No. 14/638,954, 79 pgs.
Burgener, et al., "Low Noise Charge Pump Method and Apparatus", application filed in the UPSTO, U.S. Appl. No. 13/769,780, filed Feb. 18, 2013, 27 pgs.
Englund, Terry Lee, Office Action received from the USPTO dated 12/613 for U.S. Appl. No. 13/769,780, 18 pgs.
Englund, Terry Lee, Final Office Action received from the USPTO dated Sep. 18, 2014 for U.S. Appl. No. 13/769,780, 25 pgs.
Englund, Terry Lee, Advisory Action received from the USPTO dated Jan. 6, 2015 for U.S. Appl. No. 13/769,780, 12 pgs.
Le, Dinh Thanh, Notice of Allowance received from the USPTO dated Jul. 8, 2014 for related U.S. Appl. No. 12/460,442, 15 pgs.
Nguyen, Hieu P., Notice of Allowance received from the USPTO dated Jul. 8, 2014 for related U.S. Appl. No. 13/054,781, 61 pgs.
Tran, Pablo No., Office Action received from the USPTO dated Aug. 7, 2014 for related U.S. Appl. No. 14/177,062, 7 pgs.
Englekirk, Robert Mark, Response tiled in the USPTO dated Aug. 25, 2014 for related U.S. Appl. No. 13/932,996, 14 pgs.

(56) References Cited

OTHER PUBLICATIONS

Peregrine Semiconductor Corporation, Response and English translation filed in the Japanese Patent Office dated Jun. 3, 2014 for related appln. No. 2011-171908, 21 pgs.
Imbernon, L., Decision to Grant a European Patent Pursuant to Article 97(1) EPC received from the EPO dated Jul. 3, 2014 for related appln. No. 04816848.8, 2 pgs.
Peregrine Semiconductor Corporation, Response filed in the EPO dated Aug. 19, 2014 for related appln. No. 09798318.3, 20 pgs.
Kim, et al., Comments on Examiner's Statement of Reasons for Allowance filed in the USPTO dated Jul. 14, 2014 for related U.S. Appl. No. 13/016,875, 3 pgs.
Wells, Kenneth B., Office Action received from the USPTO dated Oct. 20, 2014 for related U.S. Appl. No. 14/230,945, 5 pgs.
Burgener, et al., Amendment filed in the USPTO dated Nov. 10, 2014 for U.S. Appl. No. 14/052,680, 13 pgs.
Burgener, et al., Response filed in the USPTO dated Nov. 6, 2014 for U.S. Appl. No. 14/177,062, 15 pgs.
Nguyen, Hieh, Notice of Allowance received from the USPTO dated Nov. 13, 2014 for U.S. Appl. No. 13/054,781, 13 pgs.
Englekirk, Robert Mark, Response filed in the USPTO dated Nov. 13, 2014 for U.S. Appl. No. 13/933,006, 12 pgs.
Swonger, James, Response filed in the USPTO dated Dec. 18, 2014 for U.S. Appl. No. 14/230,945, 6 pgs.
Le, Dinh Thanh, Notice of Allowance received from the USPTO dated Jan. 2, 2015 for U.S. Appl. No. 12/460,442, 23 pgs.
Wells, Kenneth, Office Action received from the USPTO dated Jan. 20, 2015 for U.S. Appl. No. 14/230,945, 13 pgs.
Englund, Terry Lee, Final Office Action received from the USPTO dated Jan. 20, 2015 for U.S. Appl. No. 13/932,996, 65 pgs.
Peregrine Semiconductor Corporation, Response filed in the EPO dated Dec. 4, 2014 for appln. No. 14182150.4, 6 pgs.
Hiltunen, Thomas, Final Office Action received from the USPTO dated Jan. 23, 2015 for U.S. Appl. No. 13/933,006, 68 pgs.
European Patent Office, Invitation pursuant to Rule 63(1) EPC received from the EPO dated Mar. 3, 2015 for appln. No. 14182150.4, 3 pgs.
Englekirk, Robert Mark, Response to Final Pre-RCE Office Action filed in the USPTO dated Mar. 20, 2015 for U.S. Appl. No. 13/932,996, 14 pgs.
Englekirk, Robert Mark, Response After Final Office Action filed in the USPTO dated Mar. 23, 2015 for U.S. Appl. No. 13/933,006, 16 pgs.
Hiltunen, Thomas J., Final Office Action received from the USPTO dated Apr. 2, 2015 for U.S. Appl. No. 13/933,006, 20 pgs.
Imbernon, Lisa, Extended Search Report received from the EPO dated Jan. 8, 2015 for appln. No. 14178741.6, 6 pgs.
Matsumoto, Yasunori, English translation of Japanese Office Action dated Feb. 10, 2015 for appln. No. 2012-243547, 2 pgs.
Kim, et al., Comments on Examiner's Statement of Reasons for Allowance filed in the USPTO dated Feb. 13, 2015 for U.S. Appl. No. 13/054,781, 3 pgs.
Tran, Pablo N., Office Action received from the USPTO dated Feb. 24, 2015 for U.S. Appl. No. 14/177,062, 5 pgs.
Swonger, James, Amendment filed in the USPTO dated Apr. 20, 2015 for U.S. Appl. No. 14/230,945, 9 pgs.
Peregrine Semiconductor Corporation, Response filed in the EPO dated Apr. 29, 2015 for appln. No. 14182150.4, 7 pgs.
Wells, Kenneth, Final Office Action received from the USPTO dated May 6, 2015 for U.S. Appl. No. 14/230,945, 13 pgs.
Peregrine Semiconductor Corporation, English translation of a Response that was filed in the JPO dated May 12, 2015 for appln. No. 2012-243547, 4 pgs.
Englekirk, Robert Mark, Response After Final Office Action filed in the USPTO dated Jun. 2, 2015 for U.S. Appl. No. 13/933,006, 17 pgs.
Hiltunen, Thomas J., Notice of Allowance received from the USPTO dated Jun. 12, 2015 for U.S. Appl. No. 13/933,006, 17 pgs.
Swonger, James S., Amendment filed in the USPTO dated Jul. 6, 2015 for U.S. Appl. No. 14/230,945, 10 pgs.

Wells, Kenneth, Advisory Action received from the USPTO dated Jul. 15, 2015 for U.S. Appl. No. 14/230,945, 4 pgs.
Skibinski, Thomas, Office Action received from the USPTO dated Jul. 27, 2015 for U.S. Appl. No. 13/932,996, 43 pgs.
Aquilani, Dario, Extended Search Report received from the EPO dated Jun. 11, 2015 for appln. No. 14182150.4, 9 pgs.
Peregrine Semiconductor Corporation, Response filed in the EPO dated Jul. 14, 2015 for appln. No. 14178741.6, 9 pgs.
Ezzeddine, et al., "The High Voltage/High Power FET (HiVP1)", 2003 IEEE Radio Frequency Integrated Circuits Symposium, pp. 215-218.
Wells, Kenneth B., Office Action received from the USPTO dated Sep. 4, 2015 for U.S. Appl. No. 14/230,945, 79 pgs.
Hiltunen, Thomas J., Notice of Allowance received from the USPTO dated Oct. 8, 2015 for U.S. Appl. No. 13/933,006, 9 pgs.
Tran, Pablo N., Notice of Allowance received from the USPTO dated Feb. 28, 2020 for U.S. Appl. No. 16/515,967, 96 pgs.
Tran, Pablo N., Office Action received from the USPTO dated Aug. 24, 2020 for U.S. Appl. No. 16/891,519, 8 pgs.
Maxim Integrated Products, "Charge Pumps Shine in Portable Designs", published Mar. 15, 2001, pp. 1-13.
Nork, Sam, "New Charge Pumps Offer Low Input and Output Noise", Linear Technology Corporation, Design Notes, Design Note 243, Nov. 2000, pp. 1-2.
Linear Technology, "LTC1550I/LTC1551L: Low Noise Charge Pump Inverters in MS8 Shrink Cell Phone Designs", Dec. 1998, pp. 1-2.
Lascari, Lance, "Accurate Phase Noise Prediction in PLL Synthesizers", Applied Microwave & Wireless, May 2000, pp. 90-96.
Texas Instruments, "TPS60204, TPS60205, Regulated 3.3-V, 100-mA Low-Ripple Charge Pump, Low Power DC/DC Converters", Feb. 2001, Revised Sep. 2001, pp. 1-18.
Imbernon, Lisa, Communication from the European Patent office for related appln. No. 048168488, dated Apr. 6, 2009, 2 pages.
Yasuike, Kazuki, English translation of an Office Action of related appln. No. 2006-525525 received from the Japanese atent Office dated Aug. 25, 2009, 3 pgs.
Englund, Terry Lee, Office Action received from related U.S. Appl. No. 10/658,154, dated Dec. 1, 2004, 26 pages.
Burgener, Mark, et al., Amendment filed in USPTO for related U.S. Appl. No. 10/658,154, dated Apr. 1, 2005, 27 pages.
Englund, Terry Lee, Office Action received from related U.S. Appl. No. 10/658,154, dated Aug. 10, 2005, 39 pages.
Burgener, Mark, et al., Amendment After Final filed in USPTO for related U.S. Appl. No. 10/658,154, dated Oct. 11, 2005, 32 pages.
Englund, Terry, Advisory Action received from the USPTO for related U.S. Appl. No. 10/658,154, dated Nov. 2, 2005, 2 pages.
Burgener, Mark, et al., Notice of Appeal filed in USPTO for related U.S. Appl. No. 10/658,154, dated Nov. 10, 2005, 1 page.
Burgener, Mark, et al., Petition for Revival of Appln. and Facts Statement filed in USPTO for related U.S. Appl. No. 10/658,154, dated Jan. 4, 2007, 4 pgs.
Englund, Terry, Not. of Non-Compliant Appeal Brief received from the USPTO for related U.S. Appl. No. 10/658,154, dated Nov. 2, 2006, 2 pages.
Burgener, Mark, et al., Amended Appeal Brief filed in USPTO for related U.S. Appl. No. 10/658,154, dated Jan. 5, 2007, 161 pages.
Burgener, Mark, et al., Pet. to Expedite Previous Petition filed in USPTO for related U.S. Appl. No. 10/658,154, dated Jan. 8, 2007, 1 pg.
McLaughlin, Kenya, Decision of Petition under 37 CFR 1.137(f) received from USPTO for related U.S. Appl. No. 10/658,154, dated Jan. 31, 2007, 1 page.
McLaughlin, Kenya, Decision Granting received from USPTO for related U.S. Appl. No. 10/658,154, dated Mar. 28, 2007, 1 page.
Englund, Terry, Office Action received from the USPTO for related U.S. Appl. No. 10/658,154, dated May 17, 2007, 52 pages.
Burgener, Mark, et al., Amendment After Re-Opening Prosecution filed in USPTO for related U.S. Appl. No. 10/658,154, dated Sep. 17, 2007, 31 page.
Englund, Terry, Final Office Action received from the USPTO for related U.S. Appl. No. 10/658,154, dated Dec. 12, 2007, 52 pages.

(56) References Cited

OTHER PUBLICATIONS

Burgener, Mark, et al., Not. of Appeal, Pre-Appeal Brief Req. and Pre-Appeal Brief Request for Review filed in USPTO for related U.S. Appl. No. 10/658,154, dated May 12, 2008, 7 pages.
Englund, Terry, Not. of Non-Compliant Appeal Brief received from the USPTO for related U.S. Appl. No. 10/658,154, dated Apr. 1, 2009, 2 pages.
Burgener, Mark, et al., Amended Appeal Brief filed in USPTO for related U.S. Appl. No. 10/658,154, dated Jun. 1, 2009, 175 pages.
Englund, Terry, Interview Summary received from the USPTO for related U.S. Appl. No. 10/658,154, dated Oct. 9, 2009, 3 pages.
Burgener, Mark, et al., Stmt. of Substance of Interview filed in USPTO for related U.S. Appl. No. 10/658,154, dated Nov. 9, 2009, 20 pages.
Burgener, Mark, et al., Amendment filed in USPTO for related U.S. Appl. No. 10/658,154, dated Dec. 2, 2009, 19 pages.
Englund, Terry, Notice of Allowance received from the USPTO for related U.S. Appl. No. 10/658,154, dated Jan. 11, 2010, 22 pages.
Burgener, Mark, et al., Issue Fee Transmittal filed in USPTO for related U.S. Appl. No. 10/658,154, dated Mar. 23, 2010, 1 page.
Tran, Pablo N., Office Action received from the USPTO dated Oct. 29, 2009 for related U.S. Appl. No. 11/501,125, 19 pages.
Ebner von Eschenbach, Jennifer, Communication and Supplementary Search Report received from the EPO dated Nov. 27, 2009 for related appln. No, 05763216.8, 10 pages.
Kai, Tetsuo, Translation of an Office Action received from the Japanese Patent Office dated Mar. 29, 2011 for related Japanese appln. No. 2010-232563, 4 pgs.
Imbernon, Lisa, Communication Pursuant to Article 94(3) EPC received from EPO dated May 18, 2011 for related appln. No. 04816848.8, 5 pgs.
Sircus, Brian, Notification of Transmittal of International Preliminary Report on Patentability dated Aug. 10, 2011 for related application No. PCT/US2009/04149, 17 pgs.
European Patent Office, Invitation pursuant to Rule 63(1) EPC dated Aug. 19, 2011 for related appln. No. 11154275.9, 3 pgs.
Tran, Pablo N., Notice of Allowance received from the USPTO dated Oct. 6, 2011 for related U.S. Appl. No. 11/501,125, 11 pgs.
Kurzbauer, Werner, Extended European Search Report received from the EPO dated Dec. 6, 2011 for related appln. No. 11175503.9, 4 pgs.
Tran, Pablo, Office Action received from the USPTO dated Feb. 3, 2012 for related U.S. Appl. No. 12/903,848, 46 pgs.
Fedi, Giulio, Extended Search Report received from the EPO dated Mar. 5, 2012 for related appln. No. 11154277.5, 8 pgs.
Adams, W. J., et al., "OTA Extended Adjustment Range and Linearization Via Programmable Current Mirrors", Circuits and Systems, 1991, Proceedings of the 34th Midwest Symposium on Monterey, CA, USA 14-17 May 14, 1991.
Bogdan Pankiewicz, et al., "A Field Programmable Analog Array for CMOS Continuous-Time OTA-C Filter Applications", IEEE Journal of Solid-State Circuits, IEEE Service Center, vol. 37, No. 2, Feb. 1, 2002.
Jader, et al., "A Linearly Tunable Low-Voltage CMOS Transconductor with Improved Common-Mode Stability and Its Application to gm-C Filters", IEEE Transactions on Circuits and Systems II: Analog and Digitalsignal Processing, vol. 48, No. 7, Jul. 1, 2001.
Peregrine Semiconductor Corporation, Amendment filed in the EPO dated Mar. 5, 2012 for related appln. No. 11175503.9, 10 pgs.
Ghilini, Marie, Communication under Rule 71(3) EPC received from the EPO dated May 23, 2012 for related appln. No. 11175503.9, 60 pgs.
Wang, Chi-Chang, et al., "Efficiency Improvement in Charge Pump Circuits", IEEE Journal of Solid-State Circuits, vol. 32, No. 6, Jun. 1997, pp. 852-860.
Yamamoto, Kazuya, et al., "A 2.2-V Operation, 2.4-GHz Single-Chip GaAs MMIC Transceiver for Wireless Applications", IEEE Journal of Solid-State Circuits, vol. 34, No. 4, Apr. 1999, pp. 502-512.
Hiramoto, Toshiro, et al., "Low Power and Low Voltage MOSFETs with Variable Threshold Voltage Controlled by Back-Bias", IEICE Trans. Electron, vol. E83-C, No. 2, Feb. 2000, pp. 161-169.
Su, Pin, et al., "On the Body-Source Built-In Potential Lowering of SOI MOSFETs", IEEE Electron Device Letters, vol. 24, No. 2, Feb. 2003, pp. 90-92.
Yang, Min, "Sub-100nm Vertical MOSFET's with $Si1-x-y$ GexCy Source/Drains", a dissertation presented to the faculty of Princeton University, Jun. 2000, 272 pgs.
Ytterdal, T., et al., "MOSFET Device Physics and Operation", Device Modeling for Analog and RF CMOS Circuit Design, 2003 John Wiley & Sons, Ltd., 46 pgs.
Cherne, et al., U.S. Statutory Invention Registration, Registration No. H1435, May 2, 1995.
Ohyama, Hirohito, Translation of an Office Action of Japan Patent Office dated Aug. 7, 2012 for related appln. No. 2010-040443, 1 pg.
Lee, et al., "Analysis of Body Bias Effect with PD-SOI for Analog and RF Application", Solid State Electron, vol. 46, 2002, pp. 1169-1176.
Ippoushi, "SOI Structure Avoids Increases in Chip Area and Parasitic Capacitance Enables Operational Control of Transistor Threshold Voltage", Renesas Edge, vol. 2004.5, Jul. 2004, p. 15.
Hittite Microwave, Floating Ground SPNT MMIC Switch Driver Techniques, 2001.
Caverly, et al., "Gallium Nitride-Based Microwave and RF Control Devices", 2001.
Sedra, et al., "Microelectronic Circuits", University of Toronto, Oxford University Press, Fourth Edition, 1982,1987,1991,1998, pp. 374-375.
Bahl, "Lumped Elements for RF and Microwave Circuits", Artech House, 2003, pp. 353-394.
"Positive Bias GaAs Multi-Throw Switches with Integrated TTL Decoders", Hittite Microwave, 2000.
Peregrine Semiconductor Corporation, Response filed in the EPO dated Oct. 2, 2012 for related appln. No. 11154277.55, 14 pgs.
Tran, Pablo, Notice of Allowance received from the USPTO dated Oct. 26, 2012 for related U.S. Appl. No. 12/903,848, 14 pgs.
Englund, Terry Lee, Office Action received from the USPTO dated Apr. 5, 2011 for related U.S. Appl. No. 12/799,583, 5 pgs.
Burgener, et al., Amendment filed in the USPTO dated Jun. 6, 2011 for related U.S. Appl. No. 12/799,583, 7 pgs.
Englund, Terry Lee, Office Action received from the USPTO dated Aug. 18, 2011 for related U.S. Appl. No. 12/799,583, 47 pgs.
Burgener, et al., Amendment filed in the USPTO dated Feb. 17, 2012 for related U.S. Appl. No. 12/799,583, 24 pgs.
Englund, Terry Lee, Final Office Action received from the USPTO dated Apr. 20, 2012 for related U.S. Appl. No. 12/799,583, 20 pgs.
Burgener, et al., Amendment filed in the USPTO dated Jun. 19, 2012 for related U.S. Appl. No. 12/799,583, 3 pgs.
Englund, Terry Lee, Notice of Allowance received from the USPTO dated Jul. 5, 2012 for related U.S. Appl. No. 12/799,583, 8 pgs.
Englund, Terry Lee, Notice of Allowance received from the USPTO dated Oct. 12, 2012 for related U.S. Appl. No. 12/799,583, 26 pgs.
Burgener, et al., Comments on Examiner's Statement of Reasons for Allowance filed in the USPTO dated Jan. 14, 2013 for related U.S. Appl. No. 12/799,583, 3 pgs.

\* cited by examiner

LOW NOISE CHARGE PUMP METHOD AND APPARATUS

CROSS REFERENCE TO RELATED APPLICATIONS—CLAIMS OF PRIORITY

This application is a continuation of commonly assigned U.S. application Ser. No. 16/169,831, filed Oct. 24, 2018, now U.S. Pat. No. 10,608,617, issued Mar. 31, 2020; which is a continuation of commonly assigned U.S. application Ser. No. 14/883,525, filed Oct. 14, 2015, now U.S. Pat. No. 10,148,255, issued Dec. 4, 2018; which is a continuation of commonly assigned U.S. application Ser. No. 13/769,780, filed Feb. 18, 2013, now U.S. Pat. No. 9,190,902, issued Nov. 17, 2015; which is a continuation and claims the benefit of priority under 35 USC § 120 of commonly assigned U.S. application Ser. No. 12/799,583, filed Apr. 27, 2010, now U.S. Pat. No. 8,378,736, issued Feb. 19, 2013; which application Ser. No. 12/799,583 is a divisional application of commonly assigned U.S. application Ser. No. 10/658,154, filed Sep. 8, 2003, now U.S. Pat. No. 7,719,343, issued May 18, 2010; and the contents of all of the patent applications and issued patents set forth above are hereby incorporated by reference herein as if set forth in full.

BACKGROUND OF THE INVENTION

1. Field of the Invention

This invention generally relates to electronic power supplies, and more specifically to capacitive energy transfer DC-to-DC converters (DC/DC converters), such as charge pumps.

2. Related Art

DC/DC converter power supply circuits provide a DC output voltage based upon a DC source voltage. The output is typically at a different voltage than the input. As the term is used herein, DC/DC converters do not encompass voltage reduction regulator circuits that use a linear pass device, but rather involve energy transfer from input to output through an energy storage device, such as a capacitor or an inductor.

The DC/DC converters of interest herein are charge pumps, which obtain energy for the output voltage primarily by means of capacitive transfer from the source to the output. An inductor is not generally the primary energy transfer device in a charge pump, though of course hybrid devices are possible that employ inductive energy transfer in addition to capacitive energy transfer. A charge pump may derive an output voltage that is higher than a source voltage, or that is inverted from a source voltage, or that is referenced to a different voltage than the source voltage, and indeed may do all of these things concurrently.

Charge pumps may be implemented for a wide variety of purposes. They are well suited for integrated circuit fabrication because the devices and elements required are compatible with most integrated circuit fabrication techniques. For example, a charge pump may be employed to generate a negative gate bias supply for an integrated circuit that switches an antenna between send and receive circuitry of a transceiver, as shown in FIG. 1. Many wireless transceivers, such as cellular telephones, employ a single antenna for both receiving and transmitting. While such systems are receiving, an antenna 102 must be coupled to receive circuitry that may include, for example, a filter 104 and a low noise amplifier 106, to provide the received signal for further processing. However, while such systems are transmitting, the antenna 102 must be disconnected from the sensitive receive circuitry and coupled instead to relatively high power transmit circuitry. The transmit circuitry may include, for example, a power amplifier 108 and a transmit filter 110 to process a transmit signal.

A RF switch 112 may be used to perform such antenna switching functions. Ideally, such switches may be integrated together with the receive and/or transmit circuitry, and in any event are desirably very small, due to space limitations in portable transceivers such as mobile telephones and handy talkies. In order to achieve good performance from switching devices, such as MOSFETs, used to implement such RF switches, many designs need a special bias supply that extends negatively below the supply rails of the transmit and receive circuitry, such as a −3V supply. In view of the space and cost constraints of transceiver units such as mobile telephones, a charge pump is particularly suitable for generating such a bias supply, because it can be readily integrated into a very small circuit.

The RF switch 112 conveys relatively high power signals to the antenna 102 during transmission. However, during receive, the signal passed by the RF switch 112 may be measured in tens of nanovolts. Sharp noise transitions may have an extremely broad Fourier frequency content, and thus even signals at amplitudes on the order of millivolts may interfere unacceptably with reception if the signals have extremely fast edges. While the filter 104 can remove some noise, it is important that the RF switch 112 not introduce noise, particularly noise having components near the center frequency of the received signal. Thus, the receive/transmit switch of FIG. 1 illustrates one of many circumstances in which a charge pump may be desired for a circuit that nonetheless requires extremely low noise.

Unfortunately, noise generation is one of the most common drawbacks of charge pumps. Current spikes are typically coupled into both input and output supplies, together with voltage ripples and spikes. When a charge pump is integrated together with other devices, such electronic noise may be coupled throughout the circuitry of the integrated device by a variety of mechanisms that are difficult to control. Thus, a need exists for charge pumps that avoid generating excessive noise, so as to reduce charge pump noise injection into source supplies, output supplies, and related circuits.

The method and apparatus presented herein address this need for a low-noise charge pump. Various aspects of the method and apparatus described herein will be seen to provide further advantages, as well, for the design and construction of charge pumps that are relatively free of noise spurs.

SUMMARY

A charge pump method and apparatus for DC-to-DC conversion is set forth by which an output is generated by alternately coupling a transfer capacitor to an input supply and then to the output. A charge pump clock output is generated to control a transfer capacitor coupling switch in a charge pump circuit. The charge pump method (or apparatus) further includes a combination of one or more aspects of the method or apparatus, as set forth below, in order to reduce noise or otherwise improve the design.

One aspect of the charge pump method described herein includes generating an output supply by transferring charge from a source voltage to a transfer capacitor ("TC") alternately with transferring charge from the TC to the output supply. A TC-coupling switch ("TCCS") circuit is a switch that couples the TC to a supply under control of a charge pump clock ("CPClk"). This method includes coupling the TC to the output supply during discharge periods via a discharging TCCS circuit, and actively limiting a rate of voltage change of the CPClk output during both positive and negative transitions.

An aspect of the charge pump apparatus described herein may be employed to generate an output voltage supply within a circuit. This aspect includes a transfer capacitor ("TC") and a plurality of TC coupling switches ("TCCSs"), each TCCS controlled by a charge pump clock ("CPClk") output. The apparatus also has a CPClk generation circuit, which includes circuitry that limits a rate of rise of the CPClk output and circuitry that limits a rate of fall of the CPClk output. The TCCSs are coupled to the TC, and are controlled to couple the TC to a voltage source during periodic first periods, and to couple the TC to the output voltage during periodic second periods that are not concurrent with the first periods.

Another aspect of the charge pump apparatus described herein may be also be used for generating an output voltage supply within a circuit. This aspect includes a transfer capacitor ("TC") coupled alternately between source connections and output connections, and a plurality of active switches that are each switchable under control of a charge pump clock ("CPClk") output to conduct, or not. This aspect includes a CPClk generating circuit that has an active driver circuit configured to source current to, and sink current from, a driver output node, together with circuitry to limit the source current, and circuitry to limit the sink current, of the active driver circuit.

Another aspect of the charge pump described herein is a method of alternately transferring charge from a source voltage to a transfer capacitor ("TC"), and from the TC to an output supply, to generate an output supply. The method includes coupling the TC to the output supply via a discharging switch under control of a charge pump clock ("CPClk") output. The method also includes limiting source and sink currents between a driver circuit and a corresponding output node, within a generator circuit of the CPClk.

Yet another aspect of the charge pump method described herein alternately transfers charge from a source voltage to a transfer capacitor ("TC"), and from the TC to an output supply. This method includes coupling the TC to the output supply during discharge periods via a discharging switch circuit under control of a single phase charge pump clock ("CPClk") output, and coupling the TC to the voltage source via a charging switch circuit under control of the single phase CPClk output.

A related aspect of the charge pump apparatus described herein may be used for generating an output voltage supply. This apparatus includes a transfer capacitor ("TC"), one or more source switching devices in series between the TC and the source voltage, and one or more output switching devices in series between the TC and the output supply. A single phase output of a charge pump clock ("CPClk") generating circuit is coupled to all of the source switching devices to cause them to conduct only during charge periods, and is also coupled to all of the output switching devices to cause them to conduct only during discharge periods, wherein the charge and discharge periods alternate and do not overlap.

A further aspect of the charge pump method described herein may generate an output supply by alternately transferring charge from a source voltage to a transfer capacitor ("TC"), and from the TC to the output supply. This method includes coupling a first charge pump clock ("CPClk") output to a TC charging switch control node via a first capacitive coupling network, and coupling the TC to the source voltage during charge periods under control of the first CPClk output. The method also includes coupling a second CPClk output to a TC discharging switch control node via a second capacitive coupling network, and coupling the TC to the output supply during discharge periods that nonconcurrently alternate with the charge periods, under control of the second CPClk output.

A further aspect of the charge pump apparatus described herein may be used for generating an output voltage supply, and includes a transfer capacitor ("TC"). This apparatus includes one or more source switching devices, having a corresponding control node, disposed in series between the TC and a source supply, and also includes one or more output switching devices, having corresponding control nodes, disposed in series between the TC and the output supply. This apparatus also includes a capacitive coupling circuit coupling a charge pump clock output to the control node of a source switching device or to the control node of an output switching device.

Yet a further method aspect of the charge pump described herein includes steps of disposing an output hot switch between a transfer capacitor ("TC") node and a charge pump output, and disposing an output common switch between the opposite TC node and a common connection of the charge pump output. This method also includes establishing a higher control node AC impedance for the hot switch, as compared to a control node AC impedance for the output common switch. A related aspect provides apparatus generally corresponding to this method.

Embodiments of the charge pump method or apparatus may employ any combination of individual aspects of the method or apparatus, and may be configured in a wide range of charge pump architectures and configurations.

BRIEF DESCRIPTION OF THE DRAWINGS

Embodiments of the present invention will be more readily understood by reference to the following figures, in which like reference numbers and designations indicate like elements.

DETAILED DESCRIPTION

Overview—Charge Pump Configurations

Figure 2:
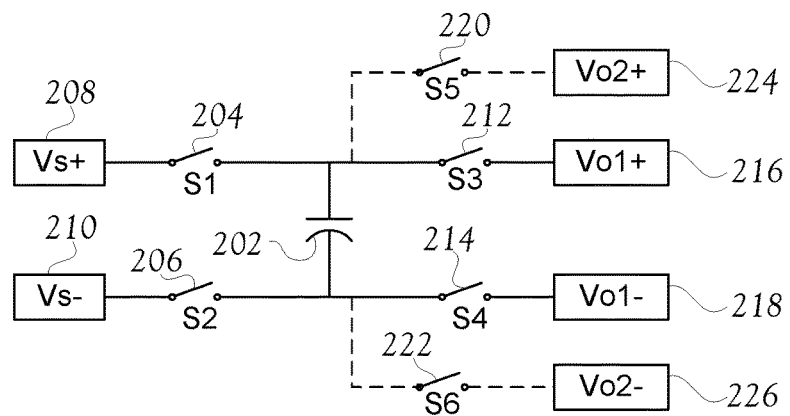
FIG. 2 is a block diagram illustrating basic charge pump operations.

FIG. 2 illustrates some basic charge pump operations. Filtering capacitors, typically present on each input and output supply, are omitted from FIG. 2 to avoid confusion with an energy transfer capacitor $C_T$ 202. When S1 204 and S2 206 are closed, $C_T$ 202 is connected to the source DC supply connections $V_S$+ 208 and $V_S$− 210, and thus $C_T$ 202 is charged to the voltage $V_S$, having a value [(Vs+)−(Vs−)]. S1 204 and S2 206 are then opened, permitting $C_T$ 202 to float. Next, S3 212 and S4 214 are closed, causing the floating transfer capacitor $C_T$ 202 to "fly" to the output supply (for which reason such capacitors are also called fly capacitors). The charged $C_T$ is thus connected to output supply connections Vo1+ 216 and Vo1− 218 (output Vo1). Presuming that the voltage of output Vo1 is smaller than the voltage stored on $C_T$ 202, $C_T$ 202 discharges, transferring energy to Vo1, which may be an output supply.

Many different output configurations are possible using just these four switches S1 204, S2 206, S3 212 and S4 214, together with the transfer capacitor $C_T$ 202. A first example is a voltage doubling configuration, wherein Vo1− 218 is connected to $V_S$+ 208, causing Vo1+ 216 to achieve a voltage roughly twice that of $V_S$+ 208 (both with respect to $V_S$− 210, neglecting losses). A second example is a voltage inverting configuration, in which Vo1+ 216 is connected to $V_S$− 210, such that Vo1− will reach approximately −$V_S$ (with respect to $V_S$− 210). A third example is a supply isolating configuration, in which neither Vo1+ 216 nor Vo1− 218 is tied through a fixed voltage connection to a source voltage connection. Rather, the input lines may be isolated from the output insofar as is permitted by the isolation capability of the switches S1 204 and S3 212, and of the switches S2 206 and S4 214.

The skilled person will understand certain features without a need for explicit details. For example, because the transfer capacitor $C_T$ 202 must be disconnected from the output while connecting to the input, maintaining a reasonably constant voltage on the output generally requires a storage device. Such storage device typically comprises a filter capacitor, which is not shown in FIG. 2. As another example, current and voltage for the output may vary depending upon many factors. The skilled person may make allowance for such factors to anticipate a voltage of the output, or may choose to regulate the voltage of the output. Such regulation is not shown, but may, for example, comprise controlling the frequency of "pump" cycles during which $C_T$ 202 is first charged to $V_S$ and then discharged to voltage Vo1. Regulation may also comprise controlling a value of the voltage source for the charge pump, as described with respect to FIG. 10 below.

Additional output connection switches, such as S5 220 and S6 222, may enable a charge pump to provide other voltages, multiplexing the use of a single transfer or fly capacitor $C_T$ 202. For example, charge and discharge cycles may alternate without overlapping. $C_T$ may be charged to $V_S$ during each charge cycle. However, during one discharge cycle, $C_T$ may be discharged to Vo2 (Vo2+ 224 to Vo2− 226), while during another discharge cycle $C_T$ is discharged to Vo1. In this manner, three voltages of roughly equal value may be created—$V_S$, Vo1 and Vo2. The connections made between these voltages determines whether the charge pump circuit functions as a voltage tripler, or as a double-voltage inverter, an isolated 2*$V_S$ supply, two isolated outputs, etc. These principles may be extended to further output combinations.

In typical implementations, each of the switches S1 204, S2 206, S3 212 and S4 214 (as well as other switches if used, such as S5 220 and S6 222) may comprise an appropriate transistor, such as a MOSFET. However, in many circumstances it is possible to substitute a simple diode for a switch, when the voltage and current flow requirements of the particular configuration of a specific charge pump circuit permit.

The basic charge pump architecture illustrated in FIG. 2 may also be replicated for operation in a "push-pull" fashion. For this purpose, a second $C_T$ may be connected to $V_S$ while the first $C_T$ is connected to Vo1, and then such second $C_T$ may be discharged to Vo1 the first $C_T$ is connected to $V_S$. Such techniques may provide more constant current capacity to the output supply, and may aid in reducing output voltage ripple. Thus, charge pump DC/DC converters may be designed in a wide range of configurations to provide many different outputs from a single DC supply.

Charge Pump Noise

Figure 3:
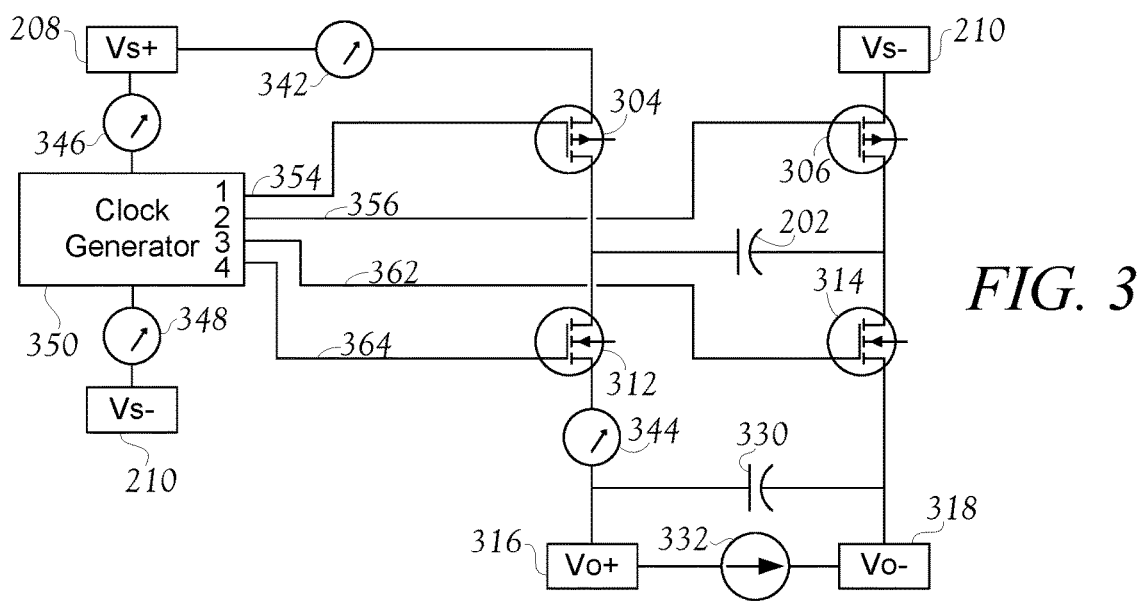
FIG. 3 is a charge pump schematic diagram illustrating some of the current paths in which noise may be reduced by employing aspects of the method and apparatus described herein.

As noted above, noise is one of the most common problems associated with charge pumps. FIG. 3 illustrates an exemplary charge pump architecture, showing some of the paths in which noise currents may typically occur. The charge pump of FIG. 3 includes a transfer capacitor $C_T$ 202, together with source supply connections Vs+ 208 and Vs− 210, which are substantially as shown in FIG. 2, and accordingly are identically numbered. FIG. 3 also includes output supply connections Vo+ 316 and Vo− 318. The fly capacitor coupling switches, which couple $C_T$ 202 to the source supply Vs or to the output supply Vo, are shown as MOSFET devices controlled by a signal applied to a control node (the device gate). The fly capacitor coupling switches include a P-channel switch 304 under control of a first clock output 354, a P-channel switch 306 under control of a second clock output 356, an N-channel switch 312 under control of a third clock output 362, and an N-channel switch 314 under control of a fourth clock output 364. The four charge pump clock outputs (354, 356, 362, and 364) are generated in a charge pump clock generator circuit 350. A filter capacitor 330 for the output supply Vo, as well as a current load 332 on Vo, are also shown.

Four ammeters are represented to illustrate paths in which noise currents may occur. From these paths, noise may be unintentionally coupled other circuits associated with the charge pump. For example, voltage noise may be coupled into other circuits through common supply connections, or via parasitic capacitive coupling, while current noise may be injected into other circuits through inductive coupling, or via a shared impedance. A source loading ammeter 342 is disposed between the source supply Vs+ 208 and the switch 304, and an output charging ammeter 344 is disposed between the switch 312 and the output filter capacitor 330. Clock generator ammeters are disposed between the clock generator 350 and its supply source, with ammeter 346 between Vs+ 208 and clock generator 350, and ammeter 348 between the clock generator 350 and Vs− 210. The explanation of charge pump noise currents, which is set forth below with reference to these four ammeters, is representative in nature, and is not intended to be comprehensive.

In FIG. 3, a charging period begins at the moment when both the switches 304 and 306 are closed, such that the $C_T$ 202 is connected across the source supply and the ammeter 342 registers the charging current for $C_T$ 202. An amplitude of a spike in the charging current is passively limited by the source impedance of the supply Vs and the parasitic resistance of $C_T$ 202 itself, as well as by the difference between Vs and the voltage on the $C_T$ 202. The spike amplitude may also be limited by active control of conduction by the switches 304 and 306. In addition to controlling peak amplitude, a rate of rise of the charging current, di/dt, may be limited by limiting the speed with which the switches 304 and 306 are turned on.

At the end of the charging period, the switches 304 and 306 will be turned off. A change in current will register in the ammeter 342 if $C_T$ 202 is not fully charged at this time, with a di/dt slope that depends in part upon the speed with which the series combination of switches 304 and 306 is turned off. Because the first clock output 354 and the second clock output 356 are coupled to corresponding control nodes of switches 304 and 306, respectively, the outputs 354 and 356 will be driven up to a voltage greater than their threshold voltages, which will induce a nonconducting off state in these switches. To drive up the voltage of the control nodes, these clock outputs source current to drive the gate capacitance (and/or other parasitic capacitances and impedances) of the corresponding switch. The drive current will register in the ammeter 346. Due to the parasitic capacitances, a high dv/dt gate drive will typically cause a significant capacitive current spike in the corresponding ammeter 346.

After the switches 304 and 306 are off, a discharge period may ensue that does not overlap the charge period. To begin the discharge period, the third clock 362 and the fourth clock 364 will raise voltages of control nodes of the switches 314 and 312, respectively, above a Vgs threshold voltage to turn each switch on to a conducting state. The resulting capacitive gate current of the switches 312 and 314 will register in the ammeter 346, with a peak value and di/dt that depend in part upon dv/dt of the clock output. In order to minimize power dissipation in the switches, the clock edges in such circuits have typically been made rather fast.

As the later of switches 312 and 314 turns on, $C_T$ 202 begins discharging into Co 330 with a current that will register in the ammeter 344. At the end of the discharge clock period, the third clock output 362 and the fourth clock output 364 sink current to drive down to an off voltage, causing gate currents, to discharge the gate capacitance of the corresponding switches, that will register in ammeter 348. Finally, $C_T$ 202 is disconnected from Co 330, which may cause another current step to register in the ammeter 344 if discharging of $C_T$ 202 has not been completed.

All switches remain off until the clock outputs 354 and 356 sink current from the gates of switches 304 and 306, respectively, to reduce the control node voltage of those switches to a level that is negatively greater than their Vgs thresholds, thereby causing the switches to turn on and begin the charging period. The sink current provided by the clock outputs 354 and 356 to effect this change will register in the ammeter 348. A di/dt of such current depends substantially upon a magnitude of the dv/dt at which these clock outputs transition negatively.

Figure 1:
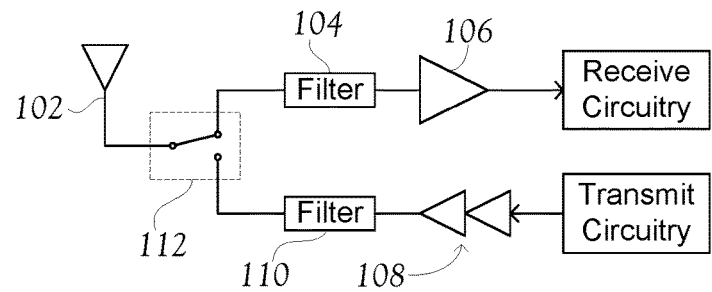
FIG. 1 is a block diagram illustrating use of a RF switch.

Each high di/dt current spike described above is likely to be coupled into nearby circuitry, whether through mutual inductances, common impedances, or common connections. Reducing some or all of the identified noise sources may be desirable for circuits, such as that described with respect to FIG. 1, which need a charge pump DC/DC converter but also require very low noise. Various features of the following figure, taken in combinations, may be employed to construct such a desirable charge pump. Other benefits will also become apparent, such as the convenience and simplicity of control by a single-phase clock.

Quiet Inverting Charge Pump

Figure 4:
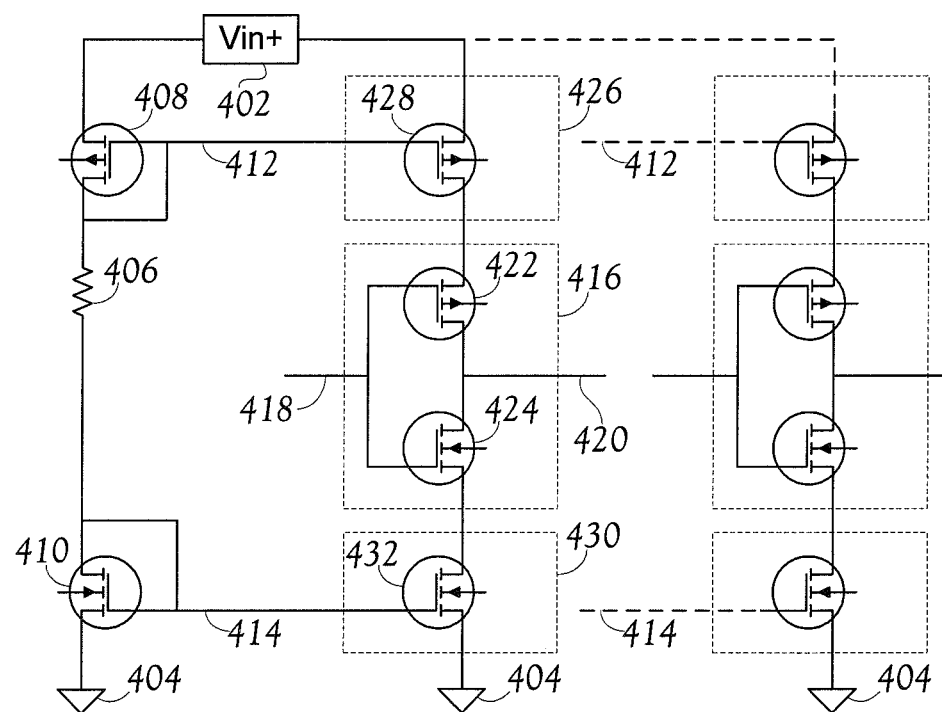
FIG. 4 is a schematic diagram of exemplary current-limited inverters.
Figure 5:
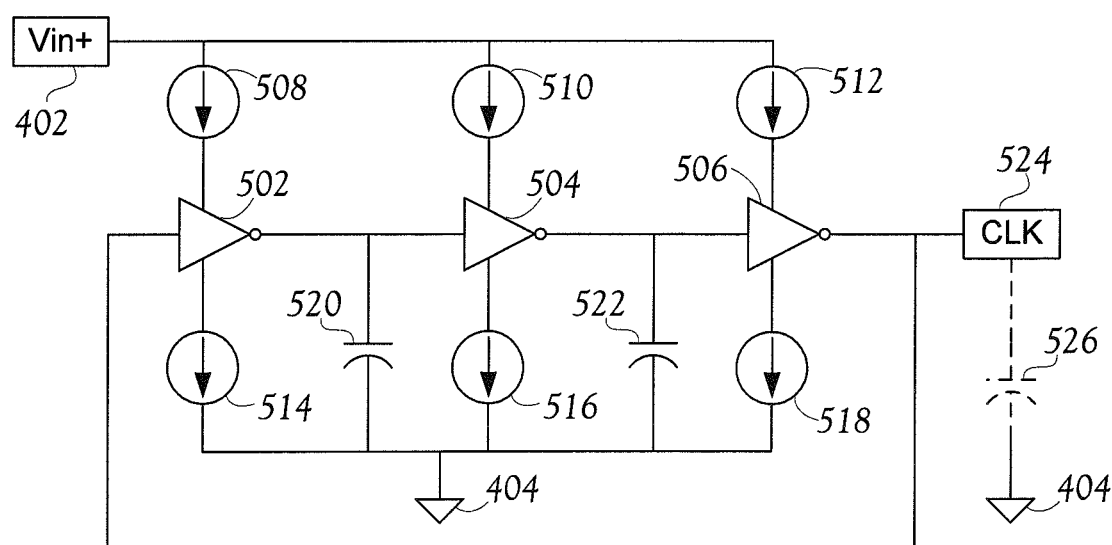
FIG. 5 is a schematic diagram of a current-starved oscillator for a charge pump.
Figure 6:
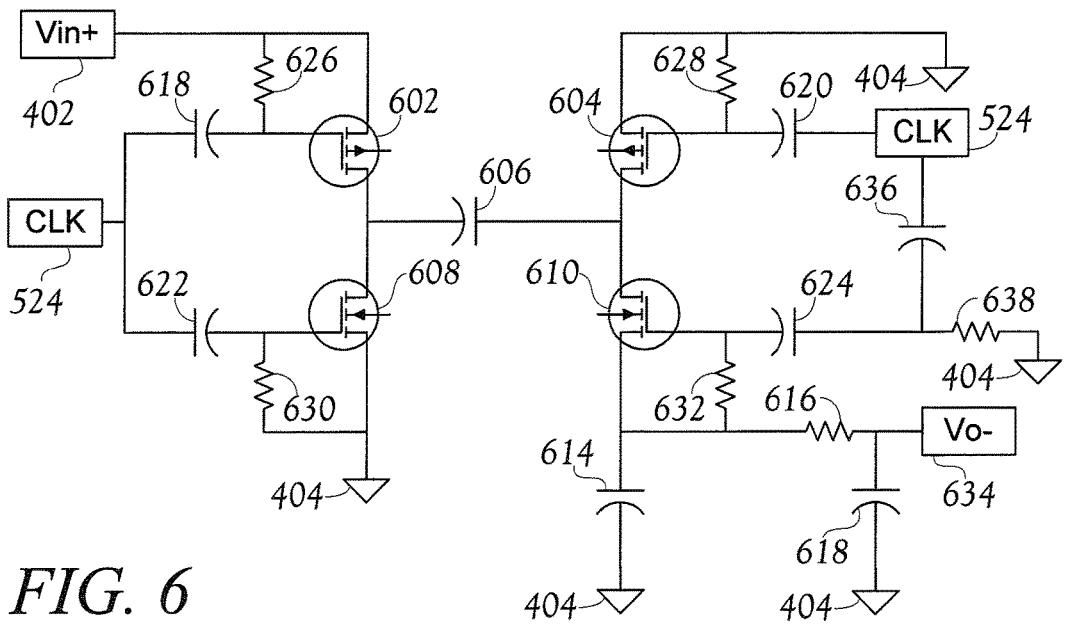
FIG. 6 is a schematic diagram of a charge pump in which the active switches are coupled to control signals by means of capacitive coupling.

FIGS. 4, 5 and 6 illustrate an exemplary quiet, inverting embodiment of a charge pump. FIG. 4 illustrates exemplary circuitry for establishing current-limited drive circuits (here, inverters), which may be used within a charge pump clock generating circuit. FIG. 5 illustrates an exemplary charge pump clock generating circuit that utilizes current-limited, inverting drive circuits configured to form a current-starved ring oscillator. FIG. 6 illustrates using a single charge pump clock output to drive all of the active fly capacitor coupling switches in an exemplary charge pump. Throughout the descriptions that are set forth below, size references for some exemplary FET devices are indicated parenthetically as a channel width (W) and length (L), in micron units. These size references are appropriate for a low voltage silicon-on-insulator ("SOI") integrated circuit, and are useful for relative size considerations. In an exemplary embodiment, threshold voltages for P-channel MOSFETs are −0.25 V, and for N-channel MOSFETs are +0.5 V. Device sizes, threshold voltages, and other considerations may, of course, be adjusted as appropriate for varying designs and processes, and indeed alternatives to MOSFETS, such as BJTs or other amplifying/switching devices, may be used with appropriate adaptation.

FIG. 4 is a schematic diagram of a current limited, inverting drive circuit. An input voltage supply is connected via Vin+ 402 and common connection 404. A reference current, limited by a resistor 406, is established through diode-connected MOSFETs 408 (W 7.5, L 2) and 410 (W 7.5, L 4) to create a P-gate reference voltage 412 and an N-gate reference voltage 414. The drive circuit 416 has an input node 418 and an output node 420, and is formed by connecting a P-channel FET 422 (W 5, L 0.8) in series with an N-channel FET 424 (W 2, L 0.8), as shown. The drive circuit 416 drives current to the output node 420, sourcing or sinking current to raise or lower the voltage of the output node. Circuitry is provided that limits the current drive capability of the drive circuit 416, as compared to an absence of such devices. "Absence" of a series device should be understood to mean replacement by a direct connection, while "absence" of a parallel device should be understood to mean merely omission of such device.

The current source capability of the driver circuit 416 is limited through a source current limit circuit 426, which may, for example, comprise a P-channel FET 428 (W 1.5, L 2). The FET 428 may be gate-coupled to the P-gate reference 412 as a current mirror that limits current, for example, to 1 µA or less. The current sink capability of the driver circuit 416 may be similarly limited by a sink current limit circuit 430, comprised for example of an N-channel FET 432 (W 1.5, L 4) coupled to the N-gate reference 414 as a current mirror (e.g. limited to 1 µA). Establishing 1 µA current limits in FETs 428 and 432 may require about 5 µA through reference current FETs 408 and 410, due to the 1:5 size ratio of the exemplary corresponding devices. Equal magnitudes for source and sink current limits may reduce undesirable harmonic generation. Any other appropriate techniques for creating current limited drive circuits may be employed in the alternative, such as using low-conductivity FETs or resistors, etc., to restrain either or both of the source and sink drive capability of such drive circuit.

Additional circuitry, shown connected by phantom lines to the P-gate and N-gate references 412 and 414, represents optional additional current-limited inverter circuits that may be coupled to the same current reference voltages 412 and 414.

FIG. 5 is a schematic diagram of a ring oscillator 500, which will be referred to as a "current-starved" ring oscillator operating with an exemplary period of 1 µS. Inverters 502, 504 and 506 may be equivalent to the inverter 416 as shown in FIG. 4. Each limits current from a source supply connection Vin+ 402 by means of a source current limit 508, 510 and 512, respectively, which may be equivalent to the source current limit 426 shown in FIG. 4. Each inverter also limits current from a sink supply connection common reference 404 by means of a sink current limit 514, 516 or 518, respectively, each of which may be equivalent to the sink current limit 430 of FIG. 4. Output transition rates (dv/dt) for the inverting drive circuit 502 are actively limited by a capacitor 520 (e.g., 90 ff) coupled to its output node, in conjunction with the "current starving" effect of the source and sink current limits 508 and 514, respectively. Similarly, dv/dt of the output node of the inverting drive circuit 504 is also actively limited by a capacitor 522 (e.g., 90 ff) coupled thereto, in conjunction with the current drive limit devices 510 and 516 of the inverting drive circuit 504.

Output transition dv/dt of CLK output 524 of the driver circuit 506 is actively limited by the source and sink current limits 512 and 518, in conjunction with the combined distributed capacitance of each driven device, which is represented by phantom capacitor 526. A discrete capacitor may, of course, be added if appropriate. The devices that constrain dv/dt on the input node of driver circuit 506 also limit dv/dt of the CLK output 524. Series connection of the three inverting driver circuits 502, 504, and 506, creates a ring oscillator. The current-starved ring oscillator 500 is an example of a charge pump clock generating circuit that includes circuits to reduce switching speeds of substantially all driver circuits within the clock generator. The current-starved ring oscillator 500 is also an exemplary circuit for producing a charge pump clock output 524 for which dv/dt is actively limited in both negative and positive transitions. Voltage of the CLK output 524 may oscillate substantially rail-to-rail (e.g., between 0 to Vin+) with low dv/dt transitions, and may have a significantly sine-like shape.

FIG. 6 is a schematic diagram of a charge pump that may employ a single phase of a limited dv/dt clock, such as the output CLK 524 of the clock generator 500 shown in FIG. 5. In an exemplary embodiment, Vin+ is +3V with respect to ground (common reference), while Vo– is –3V. P-channel MOSFETs 602 and 604 (W 20, L 0.8) conduct during a charge phase, connecting a fly capacitor 606 (e.g., 10 pf) to the source supply via connections Vin+ 402 and common reference 404. At a later time, during a discharge period, the FETs 602 and 604 will be off (nonconducting), and N-channel FETs 608 (W 20, L 0.8) and 610 (W 5, L 0.8) will conduct, connecting the fly capacitor 606 between a common reference plus side, and an intermediate output stored on a storage capacitor 614.

During this discharge period, the N-channel FET 608 couples one terminal of the fly capacitor 606 to a common reference (404) connection of the output supply. Concurrently, the N-channel FET 610 couples the opposite terminal of the fly capacitor 606 to the connection of the output supply (the junction of FET 610 and capacitor 614) that is opposite to the common reference connection of the output supply. The area of the device 610 is made much smaller (e.g., half as large, or less—one fourth as large in the exemplary embodiment) than the area of the device 608. The smaller size helps to reduce noise injection into the output, for example by minimizing coupling of control signals through the gate capacitance of the FET 610. For a typical FET, the device area is simply the length times the width. If other processing parameters are constant, a control node AC impedance (to conducting control signals into the switch) will vary approximately inversely with such area. However, control signal AC coupling impedance may be increased in other ways, for example by reducing the parasitic gate-body capacitance through increases in the dielectric thickness or reduction in the dielectric constant. Thus, the device 610 may be configured in various ways to have at least twice the control node AC impedance of the device 608.

The voltage on storage capacitor 614 is filtered, by means of a resistor 616 and filter capacitor 618, to provide a filtered output supply voltage Vo– with respect to common reference 404. The exemplary embodiment provides a quiet output but relatively low current capacity. The skilled person will readily adjust the current capacity of a circuit such as that of FIG. 6, for example by employing small (to zero) values for the resistor 616, or by replacing resistor 616 with a primarily inductive impedance. Larger devices may also be employed for any or all of FETs 602, 604, 608 and 610, as well as a larger fly capacitor 606.

Each of the FETs 602, 604, 608 and 610 is an example of an actively controllable transfer capacitor coupling switch ("TCCS"). First, each is disposed in series to couple a node of the transfer capacitor to the source supply (for charging switches) or to the output supply (for discharging switches). Second, the conductivity of each is actively controllable, under control of a signal applied to a control node of the switch (here, the gate of the FET). Such a control node has a significant impedance to primary conducting connections (here, the source and drain connections).

As shown in FIG. 6, the gate (control node) of each TCCS 602, 604, 608 and 610 may be capacitively coupled to the appropriate clock signal by means of a corresponding coupling capacitor in conjunction with a bias resistor. Direct coupling could be employed by use of appropriate level shifting and isolation considerations. For the FETs 602, 604 and 608, capacitive coupling is effected by means of capacitors (e.g., 1 pf) 618, 620 and 622, respectively, together with resistors (e.g., 10 MΩ) 626, 628 and 630, respectively.

In the case of a FET 610, the coupling is effected by two coupling circuits connected in series to reduce voltage stresses. Thus, a capacitor 636 (e.g., 2 pf) couples the CLK 524 to an intermediate node where it is biased by a resistor 638 (e.g., 10 MΩ) to an intermediate average voltage level (common reference voltage, in this case). From this intermediate node the charge pump clock output signal is coupled via a capacitor 624 (e.g., 2 pf) to the gate of the FET 610, and biased by a resistor 632 (e.g., 10 MΩ) to the source voltage of the FET. The modified capacitive coupling circuit for the FET 610 provides an example of a modified circuit that differs in some regard, but functions substantially equivalently, to another. Any circuit illustrated or described herein may be replaced (as needed) by such a modified circuit, if substantially the same function is performed. Extended voltage capacity circuits, such as series or cascode-coupled transistors or the series capacitors described above, and increased current capacity circuits, such as parallel combinations of transistors, are examples of such equivalent circuits that may be employed, in place of any illustrated circuit, to satisfy particular design goals.

In the exemplary circuit, N-channel switches such as FETs 608 and 610 are switched on concurrently while P-channel switches such as FETs 602 and 604 are off, and the converse is also true. The gate threshold voltage of N-channel switches is positive (e.g., conductive for Vgs>0.5V), while the gate threshold voltage of P-channel switches is negative (e.g., conductive for Vgs<−0.25V). The active limitation of the dv/dt transitions of CLK 524 therefore creates a period of time when all switches are off (i.e., the duration of the transition from [average of CLK 524 −0.25] to [average of CLK 524 +0.5V]. Single-phase clock drive of a charge pump may be effected using different types of switches that have correspondingly different control voltage thresholds. However, bias voltages may need to be adjusted accordingly to avoid simultaneous conduction of devices, such as FETs 602 and 608, that are disposed in series across a supply. The circuits and devices of FIG. 6 provide a convenient approach for driving all actively controllable TCCSs of a charge pump from a single clock phase (e.g., CLK 524), while ensuring that conduction periods for series fly capacitor coupling switches do not inadvertently overlap.

Each capacitive gate drive circuit shown in FIG. 6 has a time constant τ which may be expressed in terms of drive periods as R*C/(clock drive period). In the exemplary circuit of FIG. 6, τ is approximately 10 periods, because the switch drive signal CLK 524 has a period of about 1 μS. However, in many circumstances τ may be varied widely without unduly affecting operation of the circuit. τ may be enlarged as much as desired, though this may adversely affect device area. In some circumstances, τ may also be reduced, and allowed to range for example down to 5 periods, to 2 periods, to 1 period, or even to 0.1 period or less without unduly impairing performance Such reduction of τ may reduce the amplitude of the gate drive applied to the corresponding MOSFET, particularly if it is accomplished by reducing the size of the coupling capacitor (e.g., 618, 620, 622 or 624). This is due in part to capacitive voltage division between the coupling capacitor and the MOSFET gate capacitance. Such voltage division may reduce the magnitude of the control node voltage (Vgs), and hence may reduce conductivity of the switches when they are nominally enabled. Reducing τ may also reduce the proportion of time within each cycle during which the corresponding switch is turned on, which may in turn increase ripple voltages and/or load current capacity. The wide range from which τ may otherwise be chosen may be limited by such engineering considerations.

Alternative Charge Pump Embodiments

Charge pumps are extremely versatile, and aspects of the charge pump method and apparatus herein may be employed in virtually any charge pump configuration. Some alternative techniques are set forth below, each of which may be implemented using aspects of the method and apparatus described herein.

Figure 7:
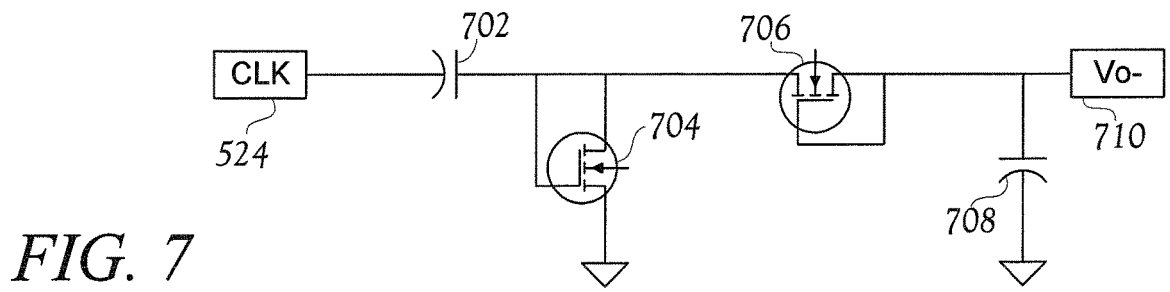
FIG. 7 is a schematic diagram of a charge pump employing passive switches.

FIG. 7 is a schematic diagram of a charge pump that generates a negative voltage Vo− 710, and provides an example of using passive transfer capacitor coupling switches. A clock source CLK 524 is provided, which may be generated, for example, by the circuit of FIG. 5. A transfer capacitor 702 charges via the clock source and via a passive switch 704 when CLK 524 is at a maximum value. When CLK 524 is at a minimum value, the transfer capacitor 702 discharges via the clock sink and a passive switch 706.

Passive switch 704 may be an N-channel enhancement MOSFET connected drain to gate and having a low threshold voltage of about 0.5V, or may be a diode (anode to capacitor 702, cathode to ground), for example a low-voltage Schottky diode. Passive switch 706 may similarly be a diode-connected N-channel enhancement FET, or may be a discrete diode with anode to output capacitor 708, cathode to transfer capacitor 702. The dv/dt control of the drive CLK 524 effects quiet operation. However, there is some loss of efficiency and voltage output due to the non-zero forward conduction voltage of the devices 704 and 706. Thus, if CLK 524 is 3V p-p (e.g., oscillates between +3V and common), then Vo− 710 may be only about −2.5V, even at light loads.

Passive switches similar to devices 704 or 706 may be substituted in place of one or more active switches in many designs described herein, simplifying design but typically reducing output voltage. For example, in FIG. 6, either or both of the active switches 604 and 610, together with their associated drive coupling circuitry, may be replaced by passive devices similar to devices 704 or 706. Passive switches are controlled by a charge pump clock output, but not via a control node. Rather, connections to primary conduction nodes of such switches are driven, through circuit operation controlled by a charge pump clock output, to voltage levels at which the devices passively switch on or off.

Figure 8:
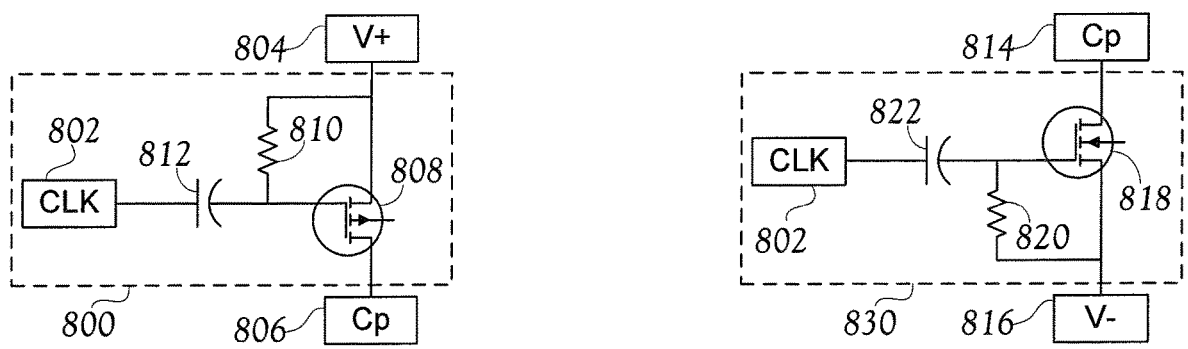
FIG. 8 is a schematic diagram of charge pump switches having a control node capacitively coupled to a charge pump clock output.

FIG. 8 is a schematic diagram of an active p-switch 800 and of an active n-switch 830. Each is driven by a clock CLK 802. The p-switch 800, when "on," connects an external supply (e.g., V+ 804) to a fly capacitor for a charge pump, represented by Cp 806. The n-switch 830, when "on," connects a charge pump fly capacitor (or transfer capacitor), represented by Cp 814, to a supply connection such as V− 816. The p-switch 800 couples CLK 802 to the gate of a P-channel MOSFET 808 via a coupling capacitor 812 and a bias resistor 810. With the bias resistor 810 connected to the source of the FET 808, it is preferable that the FET 808 has a small negative threshold voltage (e.g., −0.25V). For the n-switch 830, the gate of an N-channel MOSFET 818 is coupled to CLK 802 via a coupling capacitor 822, with a bias resistor 820 setting the average Vgs to zero volts. In this circumstance, it is preferred that the threshold voltage for the FET 818 has a small positive value (e.g. 0.5V). Depending upon voltage levels, these switches 800 and 830 may employ series capacitive coupling circuits, and/or cascode or other extended-capability circuit equivalents. The effective τ of each capacitive coupling circuit may be set in accordance with the operating frequency of a charge pump in which it is used, ranging from 10 clock periods or more down to 0.1 clock periods or less, as described with respect to FIG. 6. The τ of the capacitive coupling circuit within each n-switch and p-switch operating within a single charge pump under control of the same clock (e.g., CLK 524) may have substantially the same value. P-switches 800 and n-switches 830 may have different thresholds while operating from a common clock signal, provided that the bias voltage is set properly to ensure that a p-switch and an n-switch connected in series across a supply are precluded from concurrent conduction.

Figure 9:
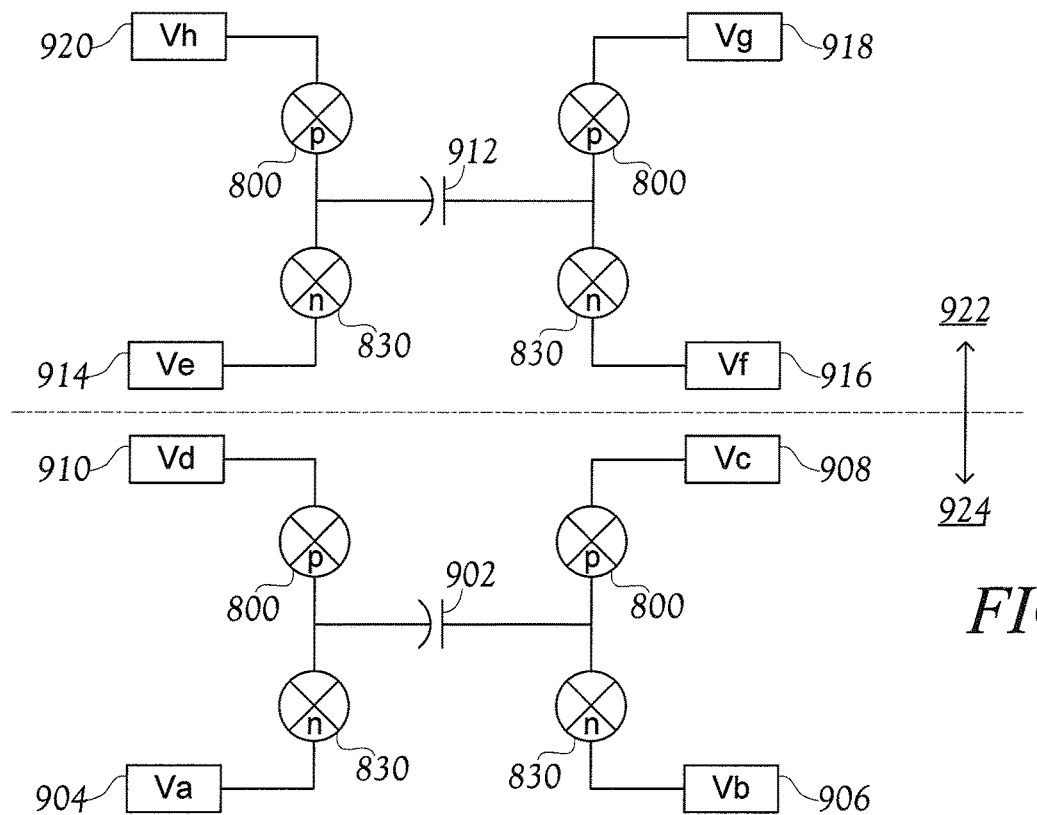
FIG. 9 is a block diagram illustrating alternative charge pump configurations.

FIG. 9 is a block schematic diagram that illustrates "stacking" charge pump circuits to obtain higher or lower output voltages. Each switch 800 and 830 may be as illustrated in FIG. 8, or as discussed in the text describing FIG. 8. The circuit of FIG. 9 may be configured as either a voltage tripler, or a voltage quadrupler, as follows: Va 904 may be connected to a positive source voltage Vs+, and Vb 906 may be connected to a common reference voltage (ground). Vc 908 may also be coupled to Vs+. Operation of the n-switches and the p-switches connected to a transfer capacitor 902 will cause Vd 910 to be driven to 2*Vs+. Ve 914 may be connected to Vd 910, and Vf 916 may be connected to ground. With those connections, an output voltage Vh 920 will be driven to approximately 3*Vs+ by means of fly capacitor 912 if Vg 918 is connected to Vs+. However, the output voltage Vh 920 will be driven to approximately 4*Vs+ if Vg 918 is connected, instead, to Vd 910. A storage capacitor, though not shown, is generally provided somewhere to store and smooth each of the voltages Va 904, Vc 908, Vd 910, Ve 914, Vg 918 and Vh 920.

The circuit of FIG. 9 may also be configured to produce negative voltages. Vh 920 may be connected to a positive source voltage Vs+, while Vg 918 and Ve 914 are connected to a reference (ground) voltage, to produce −(Vs+) at Vf 916. Vc 908 and Va 904 may be connected to Vf 916. An output Vb 906 will be approximately −2*Vs+ if Vd 910 is connected to ground. If, instead, Vd 910 is connected to Vs+, then Vd 910 will be driven to approximately −3*Vs+. Capacitive storage, not shown, is assumed for each supply and intermediate voltage.

In FIG. 9, all of the p-switches 800 and all of the n-switches 830 may be controlled by a single phase of a clock, such as CLK 524 of FIG. 5. Alternatively, a single phase of a first clock may control the switches connected to the fly capacitor 912 (i.e., the switches of a charge pump section 922), while a single phase of a different second clock may control the switches connected to the fly capacitor 902 (i.e., the switches of a charge pump section 924). If the clocks for charge pump sections 922 and 924 are inverted from one another, then the charge pump sections may be disposed in parallel to create a push-pull charge pump. That is, Va 904 may be connected to Ve 914, Vb 906 to Vf 916, Vc 908 to Vg 918, and Vd 910 to Vh 920. Such a push-pull charge pump may, for example, provide lower ripple voltage and higher output current capabilities.

Additionally, in circuits otherwise comporting with FIG. 9, one or more passive switches (such as switches 704 or 706 in FIG. 7) may replace switches in FIG. 9 that are shown (in FIG. 8) to be controlled by a charge pump clock output signal coupled to a control node of the switch. For example, the p-switch connected to Vg 918 and/or the n-switch connected to Vf 916 may be replaced by a passive switch, or by a diode. Similar substitutions may be made for the switches connected to Vc 908 and/or to Vb 906.

Moreover, if Vd 910 and Va 904 are equivalent to Vin+ 402 and common reference 404 of FIG. 5, then the left side of the transfer capacitor 902 may be coupled directly to a charge pump clock output such as 524, which would omit the left-side switches of the pump section 924 in FIG. 9. The left-side switches of section 922 of FIG. 9 may be omitted under analogous circumstances, with the left side of the transfer capacitor 912 coupled directly to a charge pump clock output instead. In such a configuration, transfer capacitor charging current and discharging current may be limited not only by a drive signal (such as that on capacitor 522 in FIG. 5) that has a limited dv/dt, but further or alternately by a current limiting device such as 512 or 518.

Figure 10:
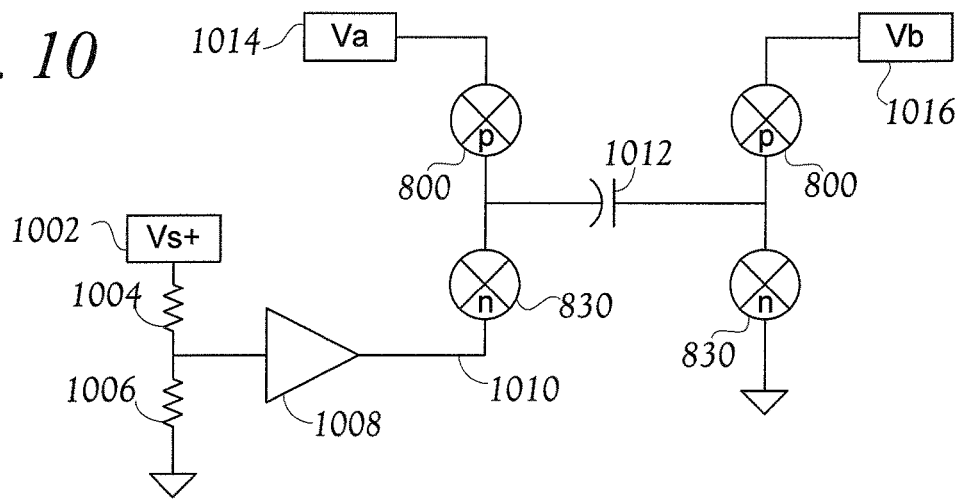
FIG. 10 is a block schematic diagram illustrating techniques for using charge pumps to produce arbitrary output voltages.

FIG. 10 is a simplified schematic diagram that illustrates generation of arbitrary voltages by means of charge pump techniques. A source voltage Vs+ 1002 may be used to derive an intermediate voltage, for example by means of resistors 1004 and 1006. Such intermediate voltage may optionally be buffered, if significant current output is desired, by means of buffer amplifier 1008, or may at least be connected to ground via a decoupling capacitor (not shown), to produce a projection voltage 1010 (with respect to common, or ground). The projection voltage 1010 may be regulated, for example by means of feedback (not shown) applied to amplifier 1008. P-switches 800 and n-switches 830 may be employed in conjunction with a fly capacitor 1012, as shown. Vb may be an available voltage source (e.g., Vs+). Operation of the circuit will establish Va 1014 at a voltage approximately equal to that of Vb 1017 plus the projection voltage 1010. The skilled person will readily see that rearrangement of the circuit will permit generation of arbitrary negative voltages with equal simplicity. Larger voltages may be obtained by stacking charge pump circuits, in a manner as described with respect to FIG. 9. Thus, arbitrary positive or negative voltages may be generated by means of charge pump circuits. All such charge pump circuits may be controlled by a single phase of a clock. Of course, the switches associated with different fly capacitors may alternatively use different clocks for control. Active switches may also be replaced with passive switches, for example in a manner as described with respect to FIG. 7 or FIG. 9.

Innumerable alternative embodiments of the charge pumps described above are possible. Any clock generator may be employed. It is desirable that the clock generator avoid introducing high di/dt noise on the supply, as can be achieved with many analog designs (for example, as shown in FIG. 5) and some digital designs. It is desirable that dv/dt of the clock drive signals be limited, both to help limit control node signal injection, and also to help limit (in conjunction with the transconductance of the relevant switch) the resulting di/dt of charging and discharging currents. It may be desirable to capacitively couple a charge pump clock to a control node of a transfer capacitor switch, for example in order to simplify control of control-node voltage levels. It may be desirable to utilize a single-phase clock output to control many, or all, of the transfer capacitor active switches within a charge pump, to minimize circuit complexity. Any of these desirable features may be effected independently, or in combination with any of the other desirable features, or in combination with any other feature described herein. Thus, the skilled person may apply aspects of the method and apparatus described herein to a staggering variety of charge pump configurations.

CONCLUSION

The foregoing description illustrates exemplary implementations, and novel features, of aspects of a charge pump method and apparatus for generating new voltages in circuits. The skilled person will understand that various omissions, substitutions, and changes in the form and details of the methods and apparatus illustrated may be made without departing from the scope of the invention. Numerous alternative implementations have been described, but it is impractical to list all embodiments explicitly. As such, each practical combination of apparatus and method alternatives that are set forth above or shown in the attached figures, and each practical combination of equivalents of such apparatus and method alternatives, constitutes a distinct alternative embodiment of the subject apparatus or methods. For example, a charge pump having a plural transfer capacitor (or 'stacked') architecture as shown in FIG. 9, having at least one passive switch as shown in FIG. 7, and having a settable voltage source as shown in FIG. 10, constitutes an embodiment of the subject apparatus, as do all other such practical combinations of subfeatures. Therefore, the scope of the presented invention should be determined only by reference to the appended claims, and is not to be limited by features illustrated in the foregoing description except insofar as such limitation is recited in an appended claim.

All variations coming within the meaning and range of equivalency of the various claim elements are embraced within the scope of the corresponding claim. Each claim set forth below is intended to encompass any system or method that differs only insubstantially from the literal language of such claim, as long as such system or method is not, in fact, an embodiment of the prior art. To this end, each described element in each claim should be construed as broadly as possible, and moreover should be understood to encompass any equivalent to such element insofar as possible without also encompassing the prior art.

What is claimed is:

1. A charge pump clock generating circuit configured to generate a clock signal for a capacitive charge pump comprising at least one transfer capacitor having an input terminal and an output terminal, and a plurality of transfer capacitor coupling switches, each coupled to the clock signal and to one of the input terminal or output terminal of a corresponding one of the at least one transfer capacitor, each transfer capacitor coupling switch being switchable between a conducting state and a non-conducting state under control of the coupled clock signal, the charge pump clock generating circuit including:
  (a) a ring oscillator comprising an odd number of inverting driver sections configured to output the clock signal; and
  (b) active limiting circuitry associated with each driver section, the active limiting circuitry including a source current limit circuit coupled between a first voltage source and the associated driver section and configured to limit the current source capability of the associated driver section, and a sink current limit circuit coupled between the associated driver section and a common reference voltage and configured to limit the current sink capability of the associated driver section, wherein the active limiting circuitry limits output transitions dv/dt of the clock signal and reduces switching speeds of substantially all of the driver sections;
  wherein the plurality of transfer capacitor coupling switches are controlled by the coupled clock signal so as to couple the input terminal of the corresponding transfer capacitor to a second voltage source during periodic first times, and to couple the output terminal of the corresponding transfer capacitor to a voltage output terminal during periodic second times that are not concurrent with the periodic first times, and
  wherein the charge pump clock generating circuit is configured such that the limited output transitions dv/dt of the clock signal create periods of time that cause all transfer capacitor coupling switches coupled to a corresponding transfer capacitor to be in the non-conducting state.

2. The invention of claim 1, wherein at least a first of the plurality of transfer capacitor coupling switches has a first gate threshold voltage and at least a second of the plurality of transfer capacitor coupling switches has a second gate threshold voltage different from the first gate threshold voltage, and wherein the clock signal during the periods of time has a voltage between the first gate threshold voltage and the second gate threshold voltage such that the at least first of the plurality of transfer capacitor coupling switches and the at least second of the plurality of transfer capacitor coupling switches are in the non-conducting state.

3. The invention of claim 1, wherein the active current limiting circuitry for each driver section includes a capacitance coupled between the output of the driver section and the common reference.

4. The invention of claim 1, wherein the charge pump clock generating circuit further includes a discrete capacitive element coupled to the output of the last driver section and configured to limit output transitions dv/dt of the clock signal.

5. The invention of claim 1, wherein the clock signal is a single-phase clock signal.

6. The invention of claim 1, wherein the ring oscillator comprises three inverting driver sections.

7. The invention of claim 1, wherein the source current limit circuit and sink current limit circuit are configured to limit the current source capability and the current sink capability to a substantially identical magnitude.

8. The invention of claim 1, wherein undesirable harmonic generation is reduced by a configuration of the source current limit circuit and of the sink current limit circuit that limits the current source capability and the current sink capability to a substantially identical magnitude.

9. The invention of claim 1, wherein the charge pump clock generating circuit is embodied within a monolithic integrated circuit.

* * * * *